(12) United States Patent
Lin et al.

(10) Patent No.: US 8,148,806 B2
(45) Date of Patent: Apr. 3, 2012

(54) MULTIPLE CHIPS BONDED TO PACKAGING STRUCTURE WITH LOW NOISE AND MULTIPLE SELECTABLE FUNCTIONS

(75) Inventors: Mou-Shiung Lin, Hsin-Chu (TW); Bryan Peng, Taoyuan (TW)

(73) Assignee: Megica Corporation, Hsinchu (TW)

( * ) Notice: Subject to any disclaimer, the term of this patent is extended or adjusted under 35 U.S.C. 154(b) by 0 days.

(21) Appl. No.: 12/269,053

(22) Filed: Nov. 12, 2008

(65) Prior Publication Data
US 2009/0057919 A1 Mar. 5, 2009

Related U.S. Application Data

(60) Continuation of application No. 10/437,333, filed on May 13, 2003, now Pat. No. 7,468,551, which is a division of application No. 09/573,955, filed on May 19, 2000, now Pat. No. 7,247,932.

(51) Int. Cl.
| | |
|---|---|
| H01L 23/48 | (2006.01) |
| H01L 25/065 | (2006.01) |
| H05K 1/02 | (2006.01) |
| H05K 1/14 | (2006.01) |
| H05K 1/00 | (2006.01) |

(52) U.S. Cl. ......... 257/686; 257/E25.013; 257/E25.011; 257/E25.03; 257/E23.004; 257/E23.067; 257/E23.069; 257/E23.079; 257/777; 257/675; 257/723; 257/784; 257/737; 257/738; 257/778; 257/773; 257/528; 257/532; 257/724; 257/691; 257/698; 257/202; 257/204; 257/208; 257/210; 257/280

(58) Field of Classification Search ............. 257/686, 257/E25.013, E25.011, E25.03, 685, E23.079, 257/777, 784, 723, 738, 778, 202, 204, 208, 257/210, 280, 724, 528, 532, 781, 779, 786, E23.004, E23.067, E23.069, 675, 737, 773, 691, 698

See application file for complete search history.

(56) References Cited

U.S. PATENT DOCUMENTS
3,668,484 A 6/1972 Greig
(Continued)

FOREIGN PATENT DOCUMENTS
JP 03-016159 1/1991
(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

Primary Examiner — A O Williams
(74) Attorney, Agent, or Firm — McDermott Will & Emery LLP

(57) ABSTRACT

The package includes a substrate, a first chip, a second chip, multiple first bumps and multiple second bumps. The substrate has a first region and a second region. The first region is substantially coplanar with the second region. The first bumps connect the first chip and the second chip. The second bumps connect the first chip and the second region of the substrate, wherein the second chip is over the first region of the substrate. The second bumps have a height greater than that of the first bumps plus the second chip. The substrate does not have an opening accommodating the second chip. The first bumps may be gold bumps or solder bumps. The second bumps may be solder bumps.

34 Claims, 8 Drawing Sheets

U.S. PATENT DOCUMENTS

| | | | |
|---|---|---|---|
| 4,598,307 A | 7/1986 | Wakabayashi et al. | |
| 4,825,276 A | 4/1989 | Kobayashi | |
| 4,918,335 A | 4/1990 | Chall, Jr. | |
| 5,083,187 A | 1/1992 | Lamson | |
| 5,148,265 A | 9/1992 | Khandros et al. | |
| 5,148,266 A | 9/1992 | Khandros et al. | |
| 5,222,014 A * | 6/1993 | Lin | 361/792 |
| 5,239,198 A | 8/1993 | Lin et al. | |
| 5,239,447 A | 8/1993 | Cotues | |
| 5,258,330 A | 11/1993 | Khandros et al. | |
| 5,282,312 A | 2/1994 | DiStefano et al. | |
| 5,346,861 A | 9/1994 | Khandros et al. | |
| 5,347,159 A | 9/1994 | Khandros et al. | |
| 5,468,984 A | 11/1995 | Efland | |
| 5,475,262 A | 12/1995 | Wang et al. | |
| 5,495,398 A | 2/1996 | Takiar | |
| 5,498,906 A | 3/1996 | Roane et al. | |
| 5,518,964 A | 5/1996 | DiStefano et al. | |
| 5,534,465 A | 7/1996 | Frye | |
| 5,570,504 A | 11/1996 | DiStefano et al. | |
| 5,583,321 A | 12/1996 | DiStefano et al. | |
| 5,587,607 A | 12/1996 | Yasuda | |
| 5,596,227 A | 1/1997 | Saito | |
| 5,608,262 A | 3/1997 | Degani et al. | |
| 5,615,824 A | 4/1997 | Fjelstad | |
| 5,640,761 A | 6/1997 | DiStefano et al. | |
| 5,646,828 A | 7/1997 | Degani | |
| 5,655,290 A | 8/1997 | Moresco et al. | |
| 5,659,952 A | 8/1997 | Kovac et al. | |
| 5,679,977 A | 10/1997 | Khandros et al. | |
| 5,682,061 A | 10/1997 | Khandros et al. | |
| 5,685,885 A | 11/1997 | Khandros et al. | |
| 5,688,716 A | 11/1997 | DiStefano et al. | |
| 5,706,174 A | 1/1998 | Distefano et al. | |
| 5,708,296 A * | 1/1998 | Bhansali | 257/698 |
| 5,760,478 A | 6/1998 | Bozso et al. | |
| 5,780,925 A | 7/1998 | Cipolla | |
| 5,789,303 A | 8/1998 | Leung et al. | |
| 5,790,384 A | 8/1998 | Ahmad et al. | |
| 5,798,286 A | 8/1998 | Faraci et al. | |
| 5,798,567 A | 8/1998 | Kelly et al. | |
| 5,801,441 A | 9/1998 | DiStefano et al. | |
| 5,801,446 A | 9/1998 | DiStefano | |
| 5,814,871 A | 9/1998 | Furukawa et al. | |
| 5,818,748 A | 10/1998 | Bertin et al. | |
| 5,821,608 A | 10/1998 | DiStefano et al. | |
| 5,830,782 A | 11/1998 | Smith et al. | |
| 5,838,551 A | 11/1998 | Chan | |
| 5,847,951 A | 12/1998 | Brown et al. | |
| 5,848,467 A | 12/1998 | Khandros et al. | |
| 5,852,326 A | 12/1998 | Khandros et al. | |
| 5,854,534 A | 12/1998 | Beilin et al. | |
| 5,861,666 A | 1/1999 | Bellaar | |
| 5,866,949 A | 2/1999 | Schueller | |
| 5,869,894 A | 2/1999 | Degani | |
| 5,874,781 A | 2/1999 | Fogal | |
| 5,883,426 A * | 3/1999 | Tokuno et al. | 257/686 |
| 5,885,849 A | 3/1999 | DiStefano | |
| 5,886,408 A | 3/1999 | Ohki et al. | |
| 5,898,223 A | 4/1999 | Frye et al. | |
| 5,913,109 A | 6/1999 | Distefano et al. | |
| 5,914,533 A | 6/1999 | Frech et al. | |
| 5,915,170 A | 6/1999 | Raab et al. | |
| 5,926,061 A | 7/1999 | Usui | |
| 5,935,404 A | 8/1999 | Farooq et al. | |
| 5,939,782 A | 8/1999 | Malladi | |
| 5,940,278 A | 8/1999 | Schumacher | |
| 5,950,304 A | 9/1999 | Khandros et al. | |
| 5,959,354 A | 9/1999 | Smith et al. | |
| 5,963,110 A | 10/1999 | Ihara et al. | |
| 5,973,392 A * | 10/1999 | Senba et al. | 257/686 |
| 5,977,640 A * | 11/1999 | Bertin et al. | 257/777 |
| 5,980,270 A | 11/1999 | Fjelstad | |
| 5,983,492 A | 11/1999 | Fjelstad | |
| 5,989,936 A | 11/1999 | Smith et al. | |
| 5,989,939 A | 11/1999 | Fjelstad | |
| 5,994,166 A | 11/1999 | Akram et al. | |
| 5,994,781 A | 11/1999 | Smith | |
| 6,012,224 A | 1/2000 | DiStefano et al. | |
| 6,018,192 A | 1/2000 | Root et al. | |
| 6,020,220 A | 2/2000 | Gilleo et al. | |
| 6,022,758 A | 2/2000 | Badehi | |
| 6,025,648 A * | 2/2000 | Takahashi et al. | 257/778 |
| 6,030,856 A | 2/2000 | DiStefano et al. | |
| 6,046,076 A | 4/2000 | Mitchell et al. | |
| 6,049,467 A * | 4/2000 | Tamarkin et al. | 361/790 |
| 6,054,008 A | 4/2000 | Chan et al. | |
| 6,054,337 A | 4/2000 | Solberg | |
| 6,075,289 A | 6/2000 | DiStefano | |
| 6,080,603 A | 6/2000 | DiStefano et al. | |
| 6,084,308 A | 7/2000 | Kelkar et al. | |
| 6,100,594 A | 8/2000 | Fukui | |
| 6,104,087 A | 8/2000 | DiStefano et al. | |
| 6,117,964 A | 9/2000 | Falcone | |
| 6,121,676 A | 9/2000 | Solberg | |
| 6,126,428 A | 10/2000 | Mitchell et al. | |
| 6,127,724 A | 10/2000 | DiStefano | |
| 6,133,626 A | 10/2000 | Hawke et al. | |
| 6,133,627 A | 10/2000 | Khandros et al. | |
| 6,133,639 A | 10/2000 | Kovac et al. | |
| 6,137,164 A * | 10/2000 | Yew et al. | 257/686 |
| 6,140,144 A | 10/2000 | Najafi | |
| 6,144,507 A | 11/2000 | Hashimoto | |
| 6,147,400 A | 11/2000 | Faraci et al. | |
| 6,147,401 A | 11/2000 | Solberg | |
| 6,150,724 A | 11/2000 | Wenzel et al. | |
| 6,154,370 A | 11/2000 | Degani | |
| 6,157,080 A | 12/2000 | Tamaki | |
| 6,162,661 A | 12/2000 | Link | |
| 6,169,328 B1 | 1/2001 | Mitchell et al. | |
| 6,177,636 B1 | 1/2001 | Fjelstad | |
| 6,177,731 B1 | 1/2001 | Ishida | |
| 6,180,426 B1 | 1/2001 | Lin | |
| 6,188,028 B1 | 2/2001 | Haba et al. | |
| 6,191,368 B1 | 2/2001 | DiStefano et al. | |
| 6,194,291 B1 | 2/2001 | DiStefano et al. | |
| 6,202,298 B1 | 3/2001 | Smith | |
| 6,207,467 B1 | 3/2001 | Vaiyapuri | |
| 6,211,572 B1 | 4/2001 | Fjelstad et al. | |
| 6,217,972 B1 | 4/2001 | Beroz et al. | |
| 6,218,729 B1 | 4/2001 | Zavrel, Jr. et al. | |
| 6,219,254 B1 | 4/2001 | Akerling et al. | |
| 6,225,688 B1 | 5/2001 | Kim et al. | |
| 6,228,685 B1 | 5/2001 | Beroz et al. | |
| 6,228,686 B1 | 5/2001 | Smith et al. | |
| 6,229,100 B1 | 5/2001 | Fjelstad | |
| 6,229,220 B1 | 5/2001 | Saitoh et al. | |
| 6,229,711 B1 | 5/2001 | Yoneda | |
| 6,235,996 B1 | 5/2001 | Farooq et al. | |
| 6,238,949 B1 | 5/2001 | Nguyen et al. | |
| 6,239,366 B1 | 5/2001 | Hsuan | |
| 6,239,367 B1 | 5/2001 | Hsuan et al. | |
| 6,239,384 B1 | 5/2001 | Smith et al. | |
| 6,239,484 B1 | 5/2001 | Dore et al. | |
| 6,242,812 B1 | 6/2001 | Choi | |
| 6,252,301 B1 | 6/2001 | Gilleo et al. | |
| 6,253,992 B1 | 7/2001 | Fjelstad | |
| 6,265,759 B1 | 7/2001 | DiStefano et al. | |
| 6,265,765 B1 | 7/2001 | DiStefano et al. | |
| 6,274,931 B1 | 8/2001 | Jeon | |
| 6,281,588 B1 | 8/2001 | DiStefano et al. | |
| 6,284,563 B1 | 9/2001 | Fjelstad | |
| 6,294,040 B1 | 9/2001 | Raab et al. | |
| 6,294,406 B1 | 9/2001 | Bertin | |
| 6,294,408 B1 | 9/2001 | Edwards et al. | |
| 6,297,551 B1 | 10/2001 | Dudderar | |
| 6,300,254 B1 | 10/2001 | Raab | |
| 6,303,996 B2 | 10/2001 | Lin | |
| 6,303,997 B1 | 10/2001 | Lee | |
| 6,307,260 B1 | 10/2001 | Smith et al. | |
| 6,309,915 B1 | 10/2001 | DiStefano | |
| 6,310,386 B1 | 10/2001 | Shenoy | |
| 6,313,521 B1 | 11/2001 | Baba | |
| 6,313,528 B1 | 11/2001 | Solberg | |
| 6,324,754 B1 | 12/2001 | DiStefano | |
| 6,329,605 B1 | 12/2001 | Beroz | |
| 6,329,607 B1 | 12/2001 | Fjelstad et al. | |

| | | |
|---|---|---|
| 6,330,164 B1 | 12/2001 | Khandros et al. |
| 6,335,222 B1 | 1/2002 | DiStefano |
| 6,335,887 B1 | 1/2002 | Aoki |
| 6,338,982 B1 | 1/2002 | Beroz et al. |
| 6,346,743 B1 | 2/2002 | Figueroa et al. |
| 6,354,485 B1 | 3/2002 | DiStefano |
| 6,356,958 B1 | 3/2002 | Lin |
| 6,359,335 B1 | 3/2002 | Distefano et al. |
| 6,361,959 B1 | 3/2002 | Beroz et al. |
| 6,362,525 B1 | 3/2002 | Rahim |
| 6,365,436 B1 | 4/2002 | Faraci et al. |
| 6,365,975 B1 | 4/2002 | DiStefano et al. |
| 6,366,467 B1 | 4/2002 | Patel et al. |
| 6,369,435 B1 | 4/2002 | Igel |
| 6,369,443 B1 | 4/2002 | Baba |
| 6,369,448 B1 | 4/2002 | McCormick |
| 6,370,010 B1 | 4/2002 | Kuroda et al. |
| 6,370,013 B1 | 4/2002 | Iino et al. |
| 6,370,032 B1 | 4/2002 | DiStefano et al. |
| 6,372,527 B1 | 4/2002 | Khandros et al. |
| 6,373,141 B1 | 4/2002 | DiStefano et al. |
| 6,380,060 B1 | 4/2002 | Zohni |
| 6,380,798 B1 | 4/2002 | Mizuno et al. |
| 6,388,340 B2 | 5/2002 | DiStefano |
| 6,392,306 B1 | 5/2002 | Khandros et al. |
| 6,396,116 B1 | 5/2002 | Kelly et al. |
| 6,400,575 B1 | 6/2002 | Brown et al. |
| 6,400,576 B1 | 6/2002 | Davidson |
| 6,404,649 B1 | 6/2002 | Drake et al. |
| 6,413,353 B2 | 7/2002 | Pompeo et al. |
| 6,417,463 B1 | 7/2002 | Cornelius et al. |
| 6,420,661 B1 | 7/2002 | DiStefano et al. |
| 6,420,789 B1 | 7/2002 | Tay et al. |
| 6,423,907 B1 | 7/2002 | Haba et al. |
| 6,429,112 B1 | 8/2002 | Smith et al. |
| 6,433,419 B2 | 8/2002 | Khandros et al. |
| 6,437,430 B2 | 8/2002 | Yamada |
| 6,458,625 B2 | 10/2002 | Akram |
| 6,460,245 B1 | 10/2002 | DiStefano |
| 6,465,747 B2 | 10/2002 | DiStefano |
| 6,465,878 B2 | 10/2002 | Fjelstad et al. |
| 6,465,893 B1 | 10/2002 | Khandros et al. |
| 6,468,836 B1 | 10/2002 | DiStefano et al. |
| 6,486,003 B1 | 11/2002 | Fjelstad |
| 6,486,547 B2 | 11/2002 | Smith et al. |
| 6,489,574 B1 | 12/2002 | Otaki et al. |
| 6,492,251 B1 | 12/2002 | Haba |
| 6,495,462 B1 | 12/2002 | Haba et al. |
| 6,498,396 B1 | 12/2002 | Arimoto |
| 6,499,216 B1 | 12/2002 | Fjelstad |
| 6,502,161 B1 | 12/2002 | Perego |
| 6,512,861 B2 | 1/2003 | Chakravorty |
| 6,515,370 B2 | 2/2003 | Hashimoto |
| 6,518,666 B1 | 2/2003 | Ikeda |
| 6,521,480 B1 | 2/2003 | Mitchell et al. |
| 6,521,984 B2 | 2/2003 | Matsuura |
| 6,525,414 B2 | 2/2003 | Shiraishi et al. |
| 6,525,429 B1 | 2/2003 | Kovac et al. |
| 6,528,348 B2 * | 3/2003 | Ando et al. .................. 438/109 |
| 6,534,855 B1 | 3/2003 | Ahn et al. |
| 6,535,398 B1 | 3/2003 | Moresco |
| 6,538,331 B2 | 3/2003 | Masuda |
| 6,541,847 B1 | 4/2003 | Hofstee |
| 6,541,852 B2 | 4/2003 | Beroz et al. |
| 6,543,131 B1 | 4/2003 | Beroz et al. |
| 6,555,398 B1 | 4/2003 | Lin |
| 6,557,253 B1 | 5/2003 | Haba et al. |
| 6,558,978 B1 | 5/2003 | McCormick |
| 6,566,745 B1 | 5/2003 | Beyne |
| 6,566,760 B1 | 5/2003 | Kawamura |
| 6,570,101 B2 | 5/2003 | DiStefano et al. |
| 6,573,609 B2 | 6/2003 | Fjelstad et al. |
| 6,586,266 B1 | 7/2003 | Lin |
| 6,590,281 B2 | 7/2003 | Wu |
| 6,600,234 B2 | 7/2003 | Kuwabara et al. |
| 6,621,155 B1 | 9/2003 | Perino |
| 6,627,979 B2 | 9/2003 | Park |
| 6,631,084 B2 | 10/2003 | Keeth |
| 6,635,553 B1 | 10/2003 | DiStefano |
| 6,642,610 B2 | 11/2003 | Park |
| 6,651,321 B2 | 11/2003 | Beroz et al. |
| 6,653,563 B2 | 11/2003 | Bohr |
| 6,664,484 B2 | 12/2003 | Haba et al. |
| 6,686,015 B2 | 2/2004 | Raab et al. |
| 6,687,842 B1 | 2/2004 | DiStefano et al. |
| 6,690,186 B2 | 2/2004 | Fjelstad |
| 6,699,730 B2 | 3/2004 | Kim et al. |
| 6,707,149 B2 | 3/2004 | Smith |
| 6,707,159 B1 | 3/2004 | Kumamoto |
| 6,709,469 B1 | 3/2004 | Link |
| 6,709,895 B1 | 3/2004 | DiStefano |
| 6,716,671 B2 | 4/2004 | Warner et al. |
| 6,723,584 B2 | 4/2004 | Kovac et al. |
| 6,737,265 B2 | 5/2004 | Beroz et al. |
| 6,750,539 B2 | 6/2004 | Haba et al. |
| 6,756,663 B2 | 6/2004 | Shiraishi et al. |
| 6,756,664 B2 | 6/2004 | Yang |
| 6,762,122 B2 | 7/2004 | Mis |
| 6,763,579 B2 | 7/2004 | Haba et al. |
| 6,765,299 B2 | 7/2004 | Takahashi |
| 6,768,208 B2 | 7/2004 | Lin et al. |
| 6,774,317 B2 | 8/2004 | Fjelstad |
| 6,774,473 B1 | 8/2004 | Shen |
| 6,774,475 B2 | 8/2004 | Blackshear |
| 6,781,241 B2 * | 8/2004 | Nishimura et al. ............ 257/777 |
| 6,791,178 B2 | 9/2004 | Yamaguchi |
| 6,791,192 B2 | 9/2004 | Lin et al. |
| 6,798,070 B2 | 9/2004 | Funaya et al. |
| 6,803,663 B2 | 10/2004 | Hashimoto |
| 6,812,078 B2 | 11/2004 | Borghs et al. |
| 6,826,827 B1 | 12/2004 | Fjelstad |
| 6,828,668 B2 | 12/2004 | Smith et al. |
| 6,838,763 B2 | 1/2005 | Ahn et al. |
| 6,838,768 B2 * | 1/2005 | Corisis et al. ................. 257/738 |
| 6,847,101 B2 | 1/2005 | Fjelstad et al. |
| 6,847,107 B2 | 1/2005 | Fjelstad et al. |
| 6,848,173 B2 | 2/2005 | Fjelstad et al. |
| 6,856,007 B2 | 2/2005 | Warner |
| 6,870,267 B2 | 3/2005 | Zohni |
| 6,870,272 B2 | 3/2005 | Kovac et al. |
| 6,876,212 B2 | 4/2005 | Fjelstad |
| 6,879,491 B2 | 4/2005 | Jauregui |
| 6,885,106 B1 | 4/2005 | Damberg et al. |
| 6,888,218 B2 | 5/2005 | Kling et al. |
| 6,897,565 B2 | 5/2005 | Pflughaupt et al. |
| 6,907,658 B2 | 6/2005 | Li |
| 6,913,949 B2 | 7/2005 | Pflughaupt et al. |
| 6,939,747 B1 | 9/2005 | Lin |
| 6,940,158 B2 | 9/2005 | Haba et al. |
| 6,949,822 B2 | 9/2005 | Shivkumar et al. |
| 6,952,047 B2 | 10/2005 | Li |
| 6,952,049 B1 | 10/2005 | Ogawa et al. |
| 6,963,136 B2 | 11/2005 | Shinozaki |
| 6,965,158 B2 | 11/2005 | Smith et al. |
| 6,977,435 B2 | 12/2005 | Kim |
| 6,977,440 B2 | 12/2005 | Pflughaupt et al. |
| 7,012,323 B2 | 3/2006 | Warner et al. |
| 7,045,899 B2 | 5/2006 | Yamane |
| 7,045,901 B2 | 5/2006 | Lin et al. |
| 7,051,209 B1 | 5/2006 | Brickell |
| 7,061,121 B2 | 6/2006 | Haba |
| 7,071,547 B2 | 7/2006 | Kang et al. |
| 7,074,050 B1 | 7/2006 | Bartley |
| 7,078,819 B2 | 7/2006 | DiStefano |
| 7,084,660 B1 | 8/2006 | Ackaret |
| 7,098,078 B2 | 8/2006 | Khandros et al. |
| 7,112,879 B2 | 9/2006 | Fjelstad et al. |
| 7,114,250 B2 | 10/2006 | Haba et al. |
| 7,138,299 B2 | 11/2006 | Fjelstad |
| 7,149,095 B2 | 12/2006 | Warner et al. |
| 7,152,311 B2 | 12/2006 | Beroz et al. |
| 7,166,914 B2 | 1/2007 | DiStefano et al. |
| 7,176,506 B2 | 2/2007 | Beroz et al. |
| 7,180,165 B2 * | 2/2007 | Ellsberry et al. ............... 257/686 |
| 7,183,643 B2 * | 2/2007 | Gibson et al. ................. 257/723 |
| 7,188,413 B2 | 3/2007 | Jamil |
| 7,198,969 B1 | 4/2007 | Khandros et al. |
| 7,205,646 B2 | 4/2007 | Lin et al. |

| | | |
|---|---|---|
| 7,229,850 B2 | 6/2007 | Li |
| 7,247,932 B1 | 7/2007 | Lin et al. |
| 7,262,368 B2 | 8/2007 | Haba |
| 7,268,304 B2 | 9/2007 | Beroz |
| 7,268,426 B2 | 9/2007 | Warner |
| 7,271,481 B2 | 9/2007 | Khandros |
| 7,272,888 B2 | 9/2007 | DiStefano |
| 7,276,400 B2 | 10/2007 | Fjelstad |
| 7,288,433 B2 | 10/2007 | Haba |
| 7,291,910 B2 | 11/2007 | Khandros |
| 7,294,928 B2 | 11/2007 | Bang |
| 7,298,030 B2 | 11/2007 | McWilliams |
| 7,309,447 B2 | 12/2007 | Light |
| 7,309,910 B2 | 12/2007 | Mitchell |
| 7,317,249 B2 | 1/2008 | Crisp |
| 7,335,995 B2 | 2/2008 | Pflughaupt et al. |
| 7,360,005 B2 | 4/2008 | Lin |
| 7,368,818 B2 | 5/2008 | Kovac et al. |
| 7,372,162 B2 | 5/2008 | Lin |
| 7,378,735 B2 | 5/2008 | Lin |
| 7,408,260 B2 | 8/2008 | Fjelstad et al. |
| 7,427,423 B2 | 9/2008 | Beroz et al. |
| 7,454,834 B2 | 11/2008 | DiStefano et al. |
| 7,462,932 B2 | 12/2008 | Haba et al. |
| 7,468,551 B2 | 12/2008 | Lin et al. |
| 7,505,284 B2 | 3/2009 | Offrein |
| 7,528,008 B2 | 5/2009 | Fjelstad |
| 7,531,894 B2 | 5/2009 | Fjelstad |
| 7,566,955 B2 | 7/2009 | Warner |
| 7,589,409 B2 | 9/2009 | Gibson et al. |
| 7,754,537 B2 | 7/2010 | Haba et al. |
| 2001/0000032 A1 | 3/2001 | Smith et al. |
| 2001/0005044 A1 | 6/2001 | Fjelstad |
| 2001/0007375 A1 | 7/2001 | Fjelstad et al. |
| 2001/0010400 A1 | 8/2001 | Smith |
| 2001/0019905 A1 | 9/2001 | DiStefano et al. |
| 2001/0022396 A1 | 9/2001 | Distefano et al. |
| 2001/0030370 A1 | 10/2001 | Khandros et al. |
| 2001/0040006 A1 | 11/2001 | Pompeo et al. |
| 2001/0040290 A1 | 11/2001 | Sakurai |
| 2001/0050425 A1 | 12/2001 | Beroz et al. |
| 2001/0050441 A1 | 12/2001 | Shivkumar et al. |
| 2002/0009827 A1 | 1/2002 | Beroz et al. |
| 2002/0011662 A1 | 1/2002 | Komiya et al. |
| 2002/0011663 A1 | 1/2002 | Khandros et al. |
| 2002/0021560 A1 | 2/2002 | Jauregui |
| 2002/0027773 A1 | 3/2002 | Davidson |
| 2002/0053723 A1 | 5/2002 | Matsuura |
| 2002/0068384 A1 | 6/2002 | Beroz et al. |
| 2002/0068426 A1 | 6/2002 | Fjelstad et al. |
| 2002/0074653 A1 | 6/2002 | Khandros et al. |
| 2002/0075016 A1 | 6/2002 | Fjelstad et al. |
| 2002/0076919 A1 | 6/2002 | Peters et al. |
| 2002/0079568 A1 | 6/2002 | Degani |
| 2002/0096781 A1 | 7/2002 | Toyosawa |
| 2002/0096787 A1 | 7/2002 | Fjelstad |
| 2002/0100961 A1 | 8/2002 | Fjelstad et al. |
| 2002/0100972 A1 | 8/2002 | Kitajima et al. |
| 2002/0109213 A1 | 8/2002 | Kovac et al. |
| 2002/0109225 A1 | 8/2002 | Chen |
| 2002/0115236 A1 | 8/2002 | Fjelstad et al. |
| 2002/0125558 A1* | 9/2002 | Akram et al. .................. 257/686 |
| 2002/0148639 A1 | 10/2002 | Smith et al. |
| 2002/0155728 A1 | 10/2002 | Khandros et al. |
| 2002/0168797 A1 | 11/2002 | DiStefano |
| 2002/0175421 A1 | 11/2002 | Kimura |
| 2002/0185308 A1 | 12/2002 | Cornelius et al. |
| 2002/0195685 A1 | 12/2002 | Fjelstad et al. |
| 2003/0001286 A1 | 1/2003 | Kajiwara et al. |
| 2003/0015783 A1 | 1/2003 | Schaper |
| 2003/0027374 A1 | 2/2003 | Kovac et al. |
| 2003/0038366 A1 | 2/2003 | Kozono |
| 2003/0057544 A1 | 3/2003 | Nathan |
| 2003/0060032 A1 | 3/2003 | Beroz et al. |
| 2003/0067063 A1 | 4/2003 | Muff |
| 2003/0071346 A1 | 4/2003 | Smith et al. |
| 2003/0107118 A1 | 6/2003 | Pflughaupt et al. |
| 2003/0110452 A1 | 6/2003 | Leahy et al. |
| 2003/0122240 A1 | 7/2003 | Lin et al. |
| 2003/0127749 A1 | 7/2003 | Lin et al. |
| 2003/0168253 A1 | 9/2003 | Khandros et al. |
| 2003/0183934 A1 | 10/2003 | Barrett |
| 2003/0197287 A1 | 10/2003 | Lin et al. |
| 2003/0201529 A1 | 10/2003 | Jeong |
| 2003/0201545 A1 | 10/2003 | Lin et al. |
| 2003/0205826 A1 | 11/2003 | Lin et al. |
| 2003/0209808 A1 | 11/2003 | Baba |
| 2003/0214618 A1 | 11/2003 | Tao et al. |
| 2004/0007750 A1 | 1/2004 | Anderson et al. |
| 2004/0027813 A1 | 2/2004 | Li |
| 2004/0031972 A1 | 2/2004 | Pflughaupt et al. |
| 2004/0035519 A1 | 2/2004 | Beroz |
| 2004/0041259 A1 | 3/2004 | Yang |
| 2004/0053442 A1* | 3/2004 | Akram et al. .................. 438/106 |
| 2004/0056341 A1 | 3/2004 | Endo et al. |
| 2004/0080328 A1 | 4/2004 | Fjelstad |
| 2004/0145054 A1 | 7/2004 | Bang |
| 2004/0183193 A1 | 9/2004 | Koide et al. |
| 2004/0188855 A1* | 9/2004 | Nishimura et al. ........... 257/777 |
| 2004/0190274 A1 | 9/2004 | Saito et al. |
| 2004/0203190 A1 | 10/2004 | Pflughaupt et al. |
| 2004/0227225 A1 | 11/2004 | Fjelstad et al. |
| 2004/0227258 A1 | 11/2004 | Nakatani |
| 2004/0256738 A1 | 12/2004 | Pavier et al. |
| 2004/0262742 A1 | 12/2004 | DiStefano et al. |
| 2005/0002167 A1 | 1/2005 | Hsuan et al. |
| 2005/0047250 A1 | 3/2005 | Ruckerbauer |
| 2005/0051903 A1 | 3/2005 | Ellsberry et al. |
| 2005/0085012 A1 | 4/2005 | Fjelstad |
| 2005/0087855 A1 | 4/2005 | Khandros et al. |
| 2005/0100298 A1 | 5/2005 | Okubora et al. |
| 2005/0127489 A1 | 6/2005 | Mallik et al. |
| 2005/0139986 A1 | 6/2005 | Kovac et al. |
| 2005/0155223 A1 | 7/2005 | Fjelstad et al. |
| 2005/0173796 A1 | 8/2005 | Pflughaupt et al. |
| 2005/0194672 A1 | 9/2005 | Gibson et al. |
| 2005/0218495 A1 | 10/2005 | Khandros et al. |
| 2005/0258509 A1 | 11/2005 | Horikawa et al. |
| 2006/0022333 A1 | 2/2006 | Shivkumar et al. |
| 2006/0033216 A1 | 2/2006 | Pflughaupt et al. |
| 2006/0049498 A1 | 3/2006 | Kovac et al. |
| 2006/0049504 A1* | 3/2006 | Corisis et al. .................. 257/686 |
| 2006/0113645 A1 | 6/2006 | Warner et al. |
| 2006/0237836 A1 | 10/2006 | Fjelstad et al. |
| 2006/0244135 A1 | 11/2006 | Khandros et al. |
| 2006/0261476 A1 | 11/2006 | Fjelstad et al. |
| 2007/0066046 A1 | 3/2007 | Fjelstad |
| 2007/0096160 A1 | 5/2007 | Beroz et al. |
| 2007/0290316 A1 | 12/2007 | Gibson et al. |
| 2008/0042274 A1 | 2/2008 | Bang |
| 2008/0284037 A1 | 11/2008 | Andry |
| 2009/0056988 A1 | 3/2009 | Lin et al. |
| 2009/0200654 A1 | 8/2009 | Fjelstad |
| 2009/0200655 A1 | 8/2009 | Fjelstad |
| 2009/0236406 A1 | 9/2009 | Fjelstad |
| 2010/0013108 A1 | 1/2010 | Gibson |

FOREIGN PATENT DOCUMENTS

| | | |
|---|---|---|
| JP | 4116858 | 4/1992 |
| JP | 11214611 | 8/1999 |
| WO | WO9609746 | 3/1996 |
| WO | WO9711588 | 3/1997 |
| WO | WO9828955 | 7/1998 |
| WO | WO9844564 | 10/1998 |
| WO | WO9940761 | 8/1999 |
| WO | WO0054321 | 9/2000 |
| WO | WO03021673 | 3/2003 |
| WO | WO2004080134 | 9/2004 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Takahashi et al., "3-Dimensional Memory Module," Semi 1997, pp. 166-167.

* cited by examiner

MULTIPLE CHIPS BONDED TO PACKAGING STRUCTURE WITH LOW NOISE AND MULTIPLE SELECTABLE FUNCTIONS

This application is a continuation of application Ser. No. 10/437,333, filed on May 13, 2003, now U.S. Pat. No. 7,468,551, which is a division of application Ser. No. 09/573,955, filed on May 19, 2000, now U.S. Pat. No. 7,247,932.

This application is related to application Ser. No. 12/269,054, filed on Nov. 12, 2008 now abandoned; and is related to application Ser. No. 10/371,505, filed on Feb. 21, 2003, now U.S. Pat. No. 7,045,901; and is related to application Ser. No. 10/371,506, filed on Feb. 21, 2003, now U.S. Pat. No. 6,791,192; and is related to application Ser. No. 10/420,595, filed on Apr. 22, 2003, now U.S. Pat. No. 7,205,646; and is related to application Ser. No. 10/437,355, filed on May 13, 2003, now U.S. Pat. No. 6,768,208.

BACKGROUND OF THE INVENTION

1. Field of the Invention

This invention relates to packaging structures for integrated circuit chips and more particularly to control of functions thereof.

2. Description of Related Art

U.S. Pat. No. 5,789,303 of Leung et al., assigned to Northern Telecom Limited for "Method of Adding on Chip Capacitors to an Integrated Circuit" shows thin capacitors (100) and (200) deposited on the planarized surface of chips in FIGS. 3 and 4. The capacitor layers are formed by deposition, photolithographic masking, etching, and selective deposition as described at Col. 5. lines 17 50.

U.S. Pat. No. 5,814,871 of Furukawa et al assigned to Fujitsu, Ltd. for "Optical Semiconductor Assembly Having a Conductive Floating Pad" shows a chip capacitor (44) or (46) in FIG. 4C. thereof formed on the surface of a "metal stem 6" which carries a preamplifier IC (28).

U.S. Pat. No. 5,926,061 of Kawasaki assigned to Fujitsu, for "Power Supply Noise Eliminating Method and Semiconductor Device" shows what appears to be a planar on-chip capacitor C2 on chip (2) in FIG. 24 and described at Col. 10, lines 19 34.

U.S. Pat. No. 5,963,110 of Ihara et al., assigned to Fujitsu, for "Equalizing Filter and Control Method for Signal Equalization" shows a chip capacitor C2T in FIG. 14 bridging a pair of output patterns (P1) and (P2) and described at Col. 7, lines 26 39.

U.S. Pat. No. 4,598,307 of Wakabayashi et al. for "Integrated Circuit Device Having Package with Bypass Capacitor" shows a bypass capacitor mounted externally in an opening in a marginal area of the lid of a Integrated Circuit (IC) chip package, which is an Dual-In-Line (DIP) type package.

U.S. Pat. No. 5,475,262 of Wang et al. for "Functional Substrates for Packaging Semiconductor Chips" shows stacked multiple levels of interconnected substrates with a separate signal connection substrate, a separate capacitor substrate, a separate resistor substrate, and a separate power supply substrate. Confronting substrates have a plurality of bond pads which are interconnected by inter-substrate contacts between the substrates which may be deformable bumps or other electrical connectors or contacts selected from solder bumps, elastomer bumps and gold bumps.

U.S. Pat. No. 5,498,906 of Roane et al. for "Capacitive Coupling Configuration for an Integrated Circuit Package" shows an externally mounted bypass capacitor for a IC package.

U.S. Pat. No. 5,608,262 of Degani et al. for "Packaging Multi-Chip Modules without Wire-Bond Interconnection" describes at Col. 4, lines 8-11 "a silicon-on-silicon structure having a silicon substrate . . . provided with metallizations to which each chip or die . . . is interconnected in a flip-chip manner by means of solder . . . ."

U.S. Pat. No. 5,854,534 of Bilin et al. for "Controlled Impedance Interposer Substrate" shows an interposer which incorporates a bypass capacitor.

U.S. Pat. No. 5,898,223 of Frye et al. for "Chip-on-Chip Package" shows chip-on-chip packages using solder bump interchip connections as vias between a single level interconnection pattern on the lower support IC chip and another single level interconnection pattern on the upper chip using solder bumps to form connections between the confronting chips.

U.S. Pat. No. 5,939,782 of Malladi shows a "Package Construction for an Integrated Circuit Chip with a Bypass Capacitor" buried in a compartment defining an inner chamber in a multilayer substrate formed of a number of generally parallel insulating layers.

U.S. Pat. No. 5,818,748 of Bertin and Cronin for "Chip Function Separation onto Separate Stacked Chips" shows an chips stacked face to face connected together both physically and electrically by FSC's (Force responsive Self-interlocking microConnectors) including confronting pedestals on which FSC's are formed.

U.S. Pat. No. 5,977,640 of Bertin et al for "Highly Integrated Chip-on-Chip Packaging" shows a chip-on-chip component connection/interconnection for electrically connecting functional chips to external circuitry.

Takahashi et al. "3-Dimensional Memory Module", Semi, pp. 166 167 (1997) shows a stack of flip chips on carriers processed starting with flip chip bonding to a carrier and followed by the steps of epoxy resin casting, polishing, bump formation for stacking, and stacking multiple carriers.

SUMMARY OF THE INVENTION

The invention teaches a methods of mounting discrete chips on a chip package or multi-chip package which may include a bypass capacitor.

An object of this invention is to provide flexibility of functions of multiple chip packages.

Another object of this invention is to provide a separate inventory of products with different functions.

Still another object of this invention is control circuit design in the single chip for example for function selection.

Another object of this invention is to pack a bypass capacitor in package or in combination chip package.

A problem solved by this invention is reduction of the inventory of several products with different functions.

Another object of this invention is to eliminate I/O noise.

A chip package for semiconductor chips is provided by the method of this invention.

In accordance with a first aspect of this invention a method of forming a chip package for a semiconductor chip include the following steps to provide a device in accordance with this invention. Form a printed circuit board having a top surface and a bottom surface including a power structure and a ground structure which are selected from (a) a power bus and a ground bus, and b) a power plane and a ground plane located within the printed circuit board. Form solder connections between the printed circuit board and a chip overlying the printed circuit board in a flip chip connection. Preferably, provide a bypass capacitor with a first terminal and a second terminal, and connect the first terminal of the bypass capacitor to the power structure and connect the second terminal of the bypass capacitor to the ground structure. Juxtapose the capacitor and the power bus and ground bus with the chip, and connect the second terminal to the ground bus or ground plane. Alternatively, locate the capacitor on the opposite surface of the printed circuit board from the chip, and connect the first terminal to the power plane and connect the second terminal to the ground plane. Preferably, connect big solder balls to the opposite surface of the printed circuit board for interconnection thereof with another element.

In accordance with another aspect of this invention a method of forming a chip package for a semiconductor chip and the device produced thereby includes the following steps. Form a first printed circuit board having a top surface and a bottom surface including a power plane and a ground plane located within the first printed circuit board. Form a second printed circuit board having a top surface and a bottom surface. Bond a first chip to the top surface of the first printed circuit board and bond a second chip to the bottom surface of the first printed circuit board in a flip chip connection. Bond a third chip to the bottom surface of the second printed circuit board in a flip chip connection. Bond the chips to the printed circuit boards by means selected solder balls and gold bumps. Provide a bypass capacitor with a first terminal and a second terminal. Connect the first terminal of the bypass capacitor to the power plane. Connect the second terminal of the bypass capacitor to the ground plane. In an alternative feature, bond a fourth chip to the top surface of the second printed circuit board in a flip chip connection. Interconnect the bottom surface of the first printed circuit board and the top surface of the second printed circuit board with big solder balls. Preferably, bond a fourth chip to the second printed circuit board top surface. Provide a bypass capacitor with a first terminal and a second terminal. Connect the first terminal of the bypass capacitor to the power plane and connecting the second terminal of the bypass capacitor to the ground plane.

In accordance with still another aspect of this invention, a method of forming a chip package for semiconductor chips includes the following steps. Form a printed circuit board with a window therethrough having a length and a width and a top surface and a bottom surface. The semiconductor chips include a primary chip and a secondary chip. Form bonded connections between the top surface of the printed circuit board and the primary chip, with the primary chip overlying the window and which extends transversely across the width of the window. Then locate the secondary chip suspended within the window and form bonded connections between the secondary semiconductor chip and the primary chip in a chip-on-chip connection. Preferably, the window has a width less than the length; and the primary chip and the secondary chip have substantially equal chip lengths and substantially equal chip widths. Form the bonded connections of the chips to the printed circuit boards by means selected from solder balls and gold bumps. Preferably, form the bonded connections of the chips to the printed circuit board by means selected from a) solder balls, and b) gold bumps. Form big solder balls on the top surface of the printed circuit board.

In accordance with one more aspect of this invention, a method of forming a chip package for semiconductor chips includes the following steps. Provide a substrate having a top surface and a bottom surface. The semiconductor chips include a primary chip and a secondary chip, the primary chip having a bottom surface and the secondary chip having a top surface. Form bonded chip-on-chip connections between the top surface of the secondary chip and the bottom surface of the primary chip, and form bonded connections between the top surface of the substrate and the primary chip aside from the secondary chip leaving space between the secondary chip and the printed circuit board. The substrate comprises a ball grid array substrate. The bonded connections of the chips to the substrate are provided by means selected from solder balls, and gold bumps. Preferably, form the bonded connections between the top surface of the substrate and the primary chip aside from the secondary chip with big solder balls, the substrate comprising a ball grid array substrate, and the bonded connections of the chips to the substrate being provided by means selected from a) solder balls, and b) gold bumps.

A method of interconnecting semiconductor chips includes steps and the device produced thereby are as follows. There are semiconductor chips including a primary chip and a secondary chip, the primary chip having a top surface and the secondary chip having a bottom surface. Form bonded chip-on-chip connections between the bottom surface of the secondary chip and the top surface of the primary chip. Form bonded connections between the top surface of the primary chip aside from the secondary chip. Preferably, there are bonded connections between the top surface of the primary chip aside from the secondary chip to Tape Automated Bonding (TAB) leads.

A method of forming a chip package for semiconductor chips and the device produced thereby includes the following steps. Form a printed circuit board with a top surface and a window therethrough. Connect two or more primary semiconductor chips each of which only partially overlies the window to the top surface of a printed circuit board by solder bonds. Connect a secondary semiconductor chip located within the window to at least of the two primary chips overlying the window in a chip-on-chip connection. Preferably, connect big solder balls to the top surface of the printed circuit board aside from the primary semiconductor chips.

Finally, another aspect of this invention includes forming a chip package for a semiconductor chip and the product produced thereby by the following steps. Form a printed circuit board having a top surface and a bottom surface including a power structure and a ground structure which include a) a power bus and a ground bus, and b) a power plane and a ground plane located within the printed circuit board. Form solder connections between the printed circuit board and a plurality of chips overlying the printed circuit board in flip chip connections. Provide a bypass capacitor with a first terminal and a second terminal. Connect the first terminal of the bypass capacitor to the power structure and connect the second terminal of the bypass capacitor to the ground structure. Form optional pads for connection to optional solder balls for functional selection.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1A:
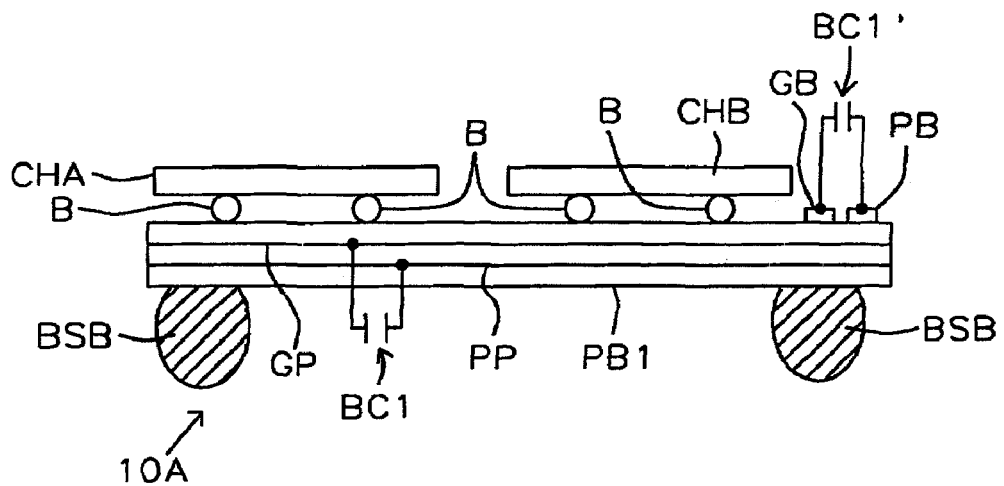
FIGS. 1A, 1B and 1C show Printed Circuit Board onto which two chips and bypass capacitors are connected in various combinations.

FIG. 1A shows a device 10A comprising a first (PCB) Printed Circuit Board PB1 composed of a conventional electrically insulating or dielectric material with a planar upper surface and a planar lower surfaces parallel to each other. On the upper surface of Printed Circuit Board PB1 are two chips CHA and CHB which are connected to the upper surface electrically and mechanically by solder balls SB to conventional pads not shown on the top surface of the printed circuit board PB1. Buried within the printed circuit board PB1 are a conductive ground plane BP and a conductive power plane PP, shown in this example, below the ground plane BP. Both the conductive ground plane BP and the conductive power plane PP are shown to be parallel with the upper and lower surface of the printed circuit board PB1. Modifications of the power plane are possible including multiple levels and variations from simple parallel structures into partially non-parallel arrangements with vias as will be well understood by those skilled in the art.

On the lower surface of the Printed Circuit Board PB1 are shown two big solder balls BSB on either end of the board PB1 which represent an array of big solder balls BSB. The big solder balls BSB are adapted to be connected electrically and mechanically to a supporting element such as another printed circuit board, e.g. a larger circuit board (not shown) as will be well understood by those skilled in the art.

Chips CHA and CHB are attached to the Printed Circuit Board PB1 by the flip-chip method, as will be well understood by those skilled in the art of chip packaging. As indicated above, there are both an internal ground plane GP and an internal power plane PP are buried within the printed circuit board (PCB) PB1. That is to say that the ground plane GP and the power plane PP are located internally, buried within the printed circuit board PB1. A bypass capacitor BC1 which is located below the bottom surface of the printed circuit board PH1 on the exterior of printed circuit board PB1 is connected directly at one end to the internal ground plane GP and is connected directly at the other terminal to the internal power plane PP as seen in FIG. 1A. The big solder balls BSB on the lower surface of the board PB1 (as shown in FIG. 1A) provide added clearance for the capacitor BC1. Thus the bypass capacitor BC1 can be located below the exterior of the lower surface of the printed circuit board PH1 and below one or both of the chip CHA and chip CHB because the big solder balls BSB are tall enough to provide clearance for the bypass capacitor BC1 (see FIG. 1A). A ground bus GB and a power bus PB are formed on the top surface of board PB1. Another bypass capacitor BC1' is shown in the right end of the board PB1 with one terminal connected to the ground bus GB and another terminal connected to the power bus PB (see FIG. 1A). The Printed Circuit Board (PCB) PB1 has a planar lower exterior surface as shown in FIG. 1A and the bypass capacitor BC1 is located below the planar exterior surface of the PCB PB1 as shown in FIG. 1A, i.e. the bypass capacitor BC1 is located outside of the PCB PB1 below the planar lower exterior surface thereof as shown in FIG. 1A.

Printed circuit board (PCB) PB1 is a multi-layer printed circuit board. The small solder balls SB connected to chip CHA and chip CHB are connected to the big solder balls BSB through the routing of the printed circuits and vias (not shown) on the printed circuit board PB1, as will be well understood by those skilled in the art of chip packaging.

Figure 1B:
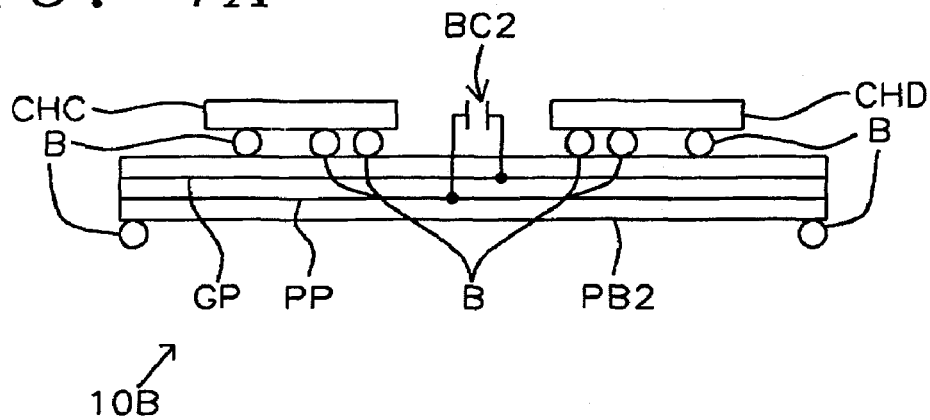

FIG. 1B shows a variation of the device of FIG. 1A comprising a modified device 10B. Device 10B includes a printed circuit board (PCB) PB2, which is basically the same as PCB PB1 (FIG. 1A) except that the connection of elements thereto is somewhat different and ground bus GB and power bus PB are omitted. Chip CHC and chip CHD, which are located on the top surface of PCB PB2, are narrower leaving space to locate the bypass capacitor BC2 there between above the exterior of the top surface of the PCB PB2 in FIG. 1B. Bypass capacitor BC2 is connected directly at one end to a buried, internal ground plane GP and at the other terminal of the bypass capacitor BC2 is connected directly to a buried, internal power plane PP (as described above with respect to FIG. 1A. In this case, the small solder balls SB are located on the bottom of the PCB PB2 (in place of the big solder balls BSB or FIG. 1A) since there is no need for the extra clearance required in FIG. 1A for location of the bypass capacitor BC1. As shown in FIG. 1B, the PCB PB2 has a planar top exterior surface and the bypass capacitor BC2 is located above the planar top exterior surface of the PCB PB2, i.e. bypass capacitor BC2 is outside of the PCB PB2 above the planar top exterior surface thereof.

Figure 1C:
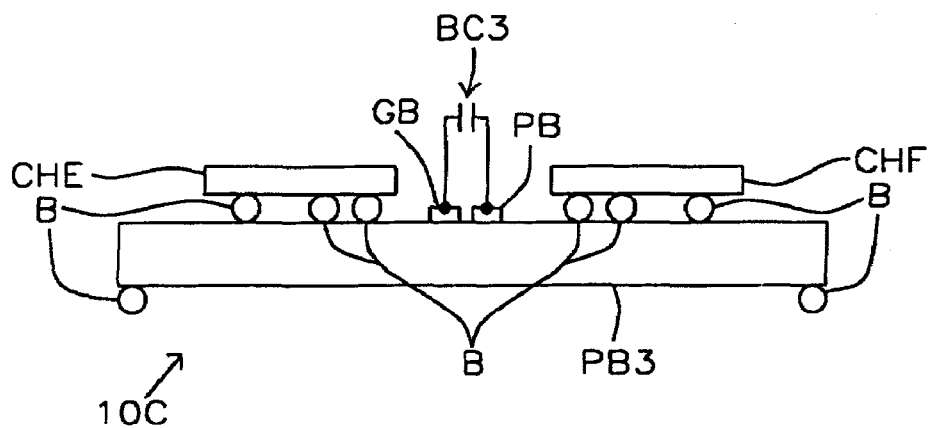

FIG. 1C shows a device 10C which is a modification of the devices 10A of FIGS. 1A and 10B of FIG. 1B. The device 10C includes a third PCB PB3, different from the PCBPB1 of FIG. 1A except that the elements connected thereto are somewhat different. In particular, PCBPB3 includes no buried ground plane and no buried power plane. Chip CHE and chip CHF, which are located on the top surface of PCBPB2, are narrower leaving space to locate the bypass capacitor BC2 therebetween on the top surface of PCBPB2. Chip CHE and chip CHF, which are located on the top surface of PCBPB2, are narrower than chips CHA and CHB, leaving space to locate the bypass capacitor BC2 therebetween on the top surface of PCBPB3. Bypass capacitor BC3 is connected at one end to the ground bus GB and at the other terminal to the power bus PP. In this case, as in FIG. 1B, small solder balls SB are located on the bottom of the PCB PB3 (in place of the big solder balls BSB or FIG. 1A). The PCB PB3 has a planar top exterior surface and the bypass capacitor BC3 is located above the planar top exterior surface of the PCB PB3, i.e. bypass capacitor BC3 is outside of the PCB PB3 above the planar top exterior surface thereof as shown by FIG. 1C.

Figure 1D:
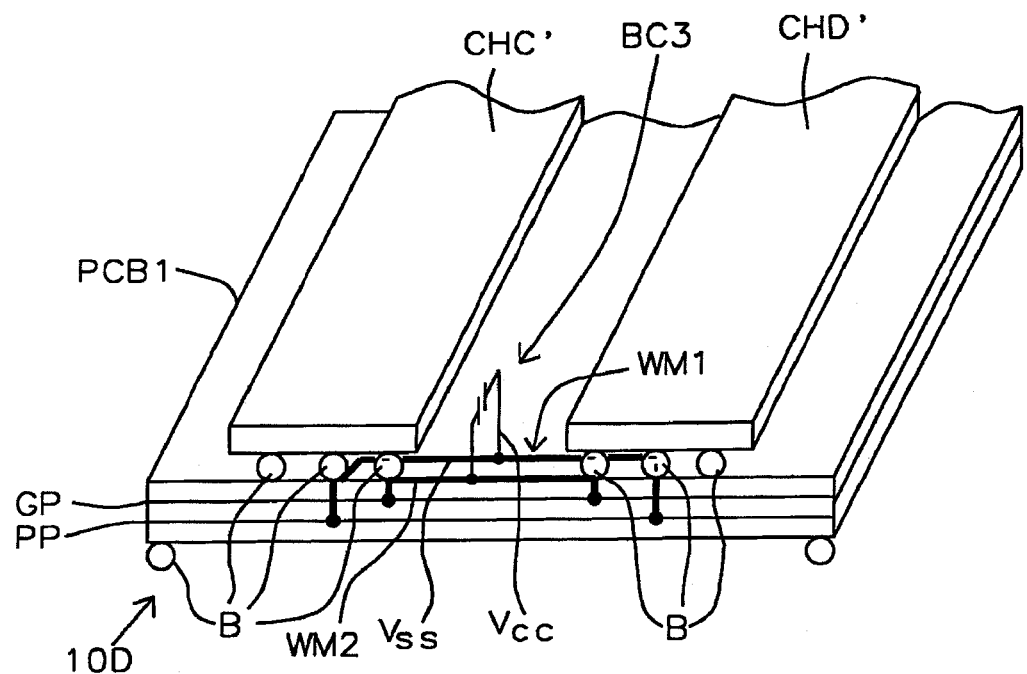
FIG. 1D shows a perspective view of a modification of FIG. 1B.

FIG. 1D shows a perspective view of a modification of FIG. 1B with two chips, chip CHC' and chip CHD' on top of the printed circuit board (PCB) PCB1 along with the bypass capacitor BC3 shown located above the exterior of the top surface of the PCB PCB1 between chips CHC', CHD'. A wide metal conductor line comprising a power bus WM1 is formed on the surface of the PCB PCB1, as shown in FIG. 1D, connecting to one terminal of the capacitor BC3 and the other wide metal line comprising ground bus WM2 on the surface of the printed circuit PCB PCB1, connecting to the other terminal of the capacitor BC3. The wide metal line power bus WM1 connects by vias to some solder balls SB in the middle of chips CHC' and CHD' and down to the buried, internal power plane PP, as shown in FIG. 1D. The wide metal line ground bus WM2 connects by other vias to other solder balls SB on the inner edges of chips CHC' and CHD', and down to the buried, internal ground plane GP, as shown in FIG. 1D. Vias are conductors as will be well understood by those skilled in the art. As can be seen in the perspective view in FIG. 1D, the PCB PB1 has a planar top exterior surface and the bypass capacitor BC3 is located above the planar top exterior surface of the PCB PB1, i.e. bypass capacitor BC3 is outside of the PCB PB1 above the planar top exterior surface thereof as shown by FIG. 1D.

Figure 2A:
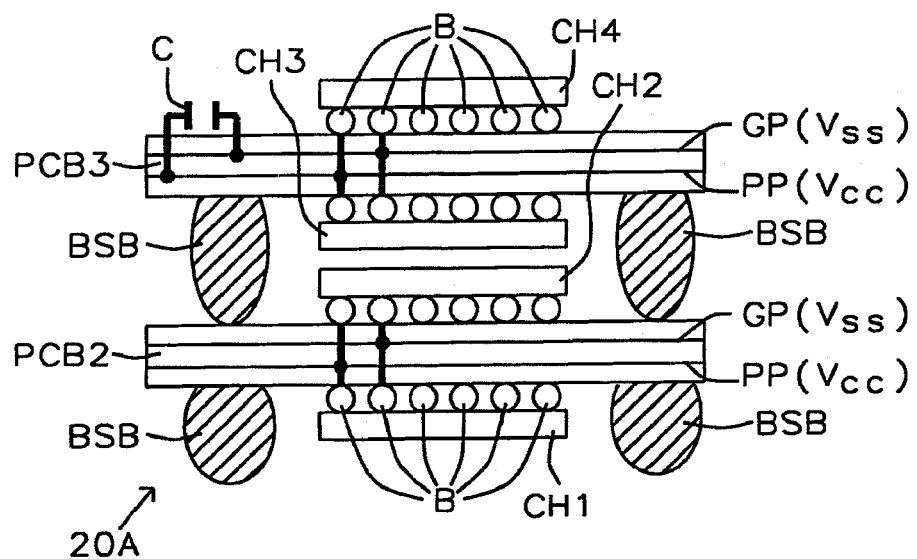
FIG. 2A shows a Printed Circuit Board onto which two chips are connected with one on the top and the other on the bottom and with a capacitor formed on the top of the board.

FIG. 2A shows a device 20A which is a modification of FIG. 1A with two stacked Printed Circuit Boards PCB2 and PCB3 (similar to boards PB1) with an plurality of big solder balls BSB on the periphery of the bottom of the boards PCB2 and PCB3, with a ground plane GP at voltage Vss and a power plane PP at voltage Vcc. The upper Printed Circuit Board PCB3 is connected to the lower Printed Circuit Board PCB2 by means of several big solder balls BSB which interconnect electrically and mechanically (as shown in FIG. 2A) between the lower surface of upper board PCB3 and lower board PCB2, as is well understood by those skilled in the art, by means of conductive mounting pads, conductors and vias not shown for convenience of illustration.

Referring to lower Printed Circuit Board PCB2, two chips CH1 and CH2 are supported on the bottom and top respectively of the lower board PCB2. Chips CH1 and CH2 are connected electrically and mechanically by solder balls SB to conventional pads not shown on the bottom surface and top surface of the printed circuit board PCB2 respectively.

Referring to upper Printed Circuit Board PCB3, two bottom-and-top mounted chips CH3 and CH4 are supported on the bottom and top respectively of lower board PCB2, and chips CH3 and CH4 which are connected electrically and mechanically by solder balls SB to conventional pads not shown on the bottom surface and top surface of the lower printed circuit board PCB2.

An capacitor C is formed on the left of the top surface of PCB PCB3. The externally located bypass capacitor C is shown in FIG. 2A located close to the chips CH3 and CH4. Bypass capacitor also can be mounted on the left top surface of top PCB PB3 to the left of chip CH4. Bypass capacitor C has one terminal connected to the ground plane GP and at the other terminal to the power plane PP above the plurality of big solder balls BSB of upper board PCB3. The circuits are similar to those as discussed in FIG. 1C. The PCB PB3 has a planar top exterior surface and the bypass capacitor C is located above the planar top exterior surface of the PCB PB3, i.e. bypass capacitor C is outside of the PCB PB3 above the planar top exterior surface thereof.

Figure 2B:
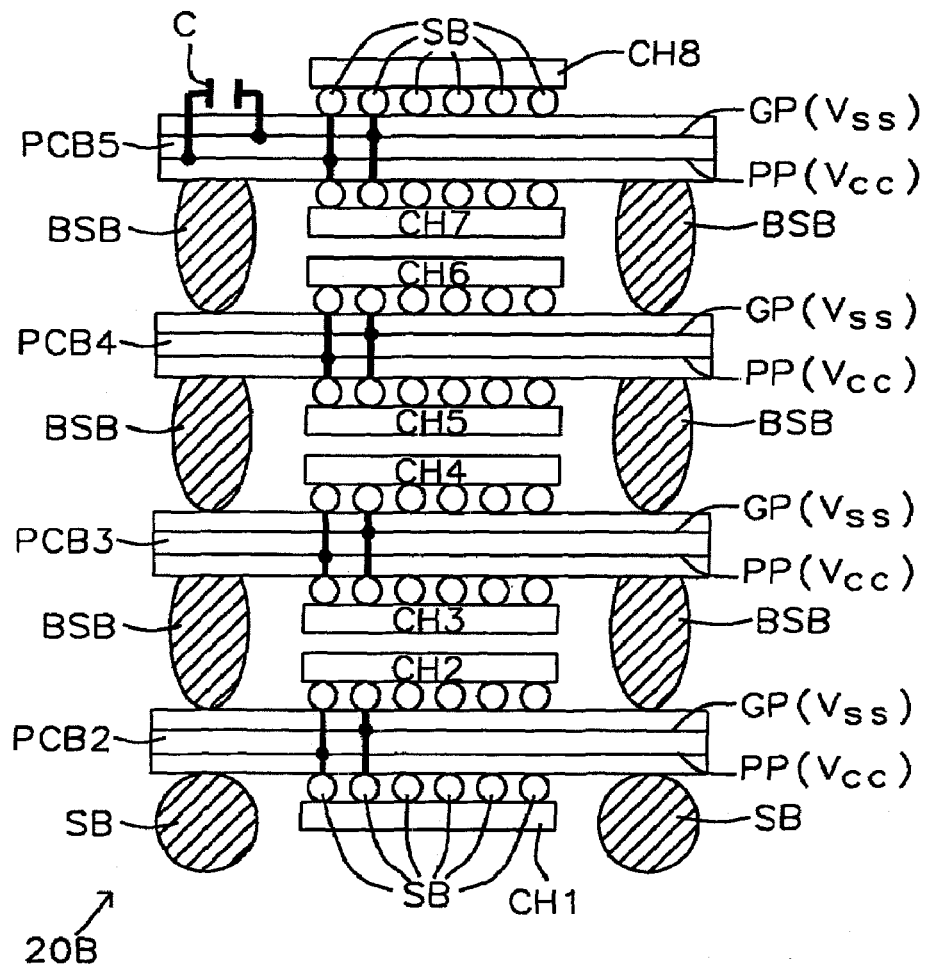
FIG. 2B shows a modification of the device of FIG. 2A which has been expanded to include additional printed circuit boards to which two chips are connected which have been stacked on top of the boards of FIG. 2A.

FIG. 2B shows device 20B which is a modification of the device 20A of FIG. 2A which has been expanded to include several additional printed circuit boards (PCB) PBC4 and PCB5 which have been stacked on top of upper PCB PCB3 carrying chips CH5 and CH6 shown mounted bottom-and-top and carrying chips CH7 and CH8 shown mounted bottom-and-top respectively with the big solder balls BSB supporting each printed circuit board (PCB), with PCB PCB4 supported on PCB PCB3 and PCB PCB5 supported on PCB PCB4 in like manner to the boards of FIG. 2A. The lower-most PCB PCB2 is shown supported on a moderate size set of enlarged solder balls SB. A bypass capacitor C, which is shown located above the exterior of the top surface of PCB PCB5 at the left end thereof, has one terminal shown connected directly to the buried, internal ground plane GP and is shown connected directly at the other terminal to the buried, internal power plane PP. The PCB PB5 has a planar top exterior surface and the bypass capacitor C is located above the planar top exterior surface of the PCB PB5, i.e. bypass capacitor C is outside of the PCB PB5 above the planar top exterior surface thereof.

Figure 2C:
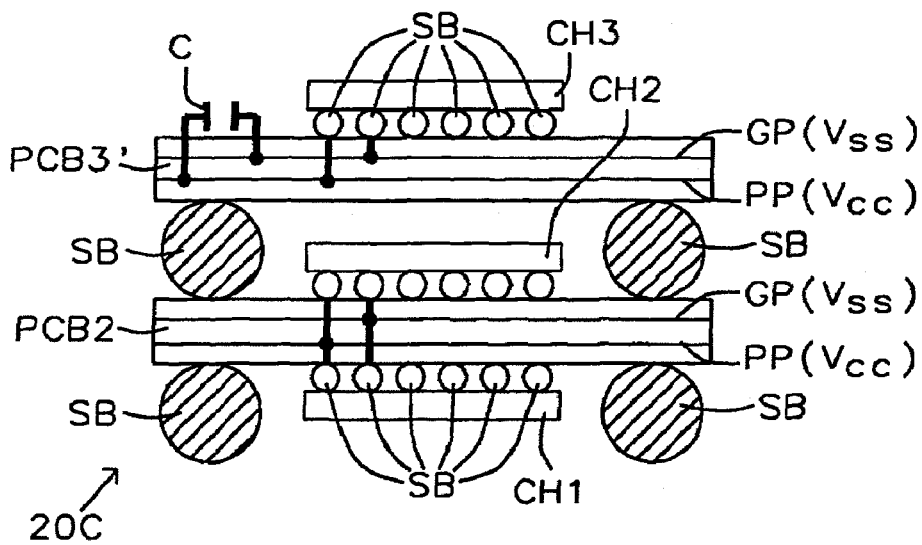
FIG. 2C shows a modification of the device of FIG. 2A which has been modified to include a single chip only on the top of the upper printed circuit board without big solder balls between the upper and lower printed circuit boards.

FIG. 2C shows a modification of the device of FIG. 2A which has been modified to include a chip CH3 on the top of the upper printed circuit board (PCB) PCB3' without big solder balls between the upper and lower PCBs. In particular, FIG. 2C shows a device 20C which is another modification of the device 20A of FIG. 2A which has been simplified to include top and bottom chips CH1 and CH2 on the lower PCB PCB2 with a single chip CH3 on the top surface of the upper PCB PCB3' with smaller solder balls SB interconnecting between the bottom of the upper PCB PCB3' and the top of lower PCB PCB2 and connected to the bottom of the lower PCB PCB2. A bypass capacitor C, shown located externally above the top surface of the upper PCB PCB3' at the left end thereof, has one terminal shown connected directly to the buried, internal power plane PP of the upper PCB PCB3'. The PCB PB3' has a planar top exterior surface and the bypass capacitor C is located above the planar top exterior surface of the PCB PB3', i.e. bypass capacitor C is outside of the PCB PB3' above the planar top exterior surface thereof.

Figure 2D:
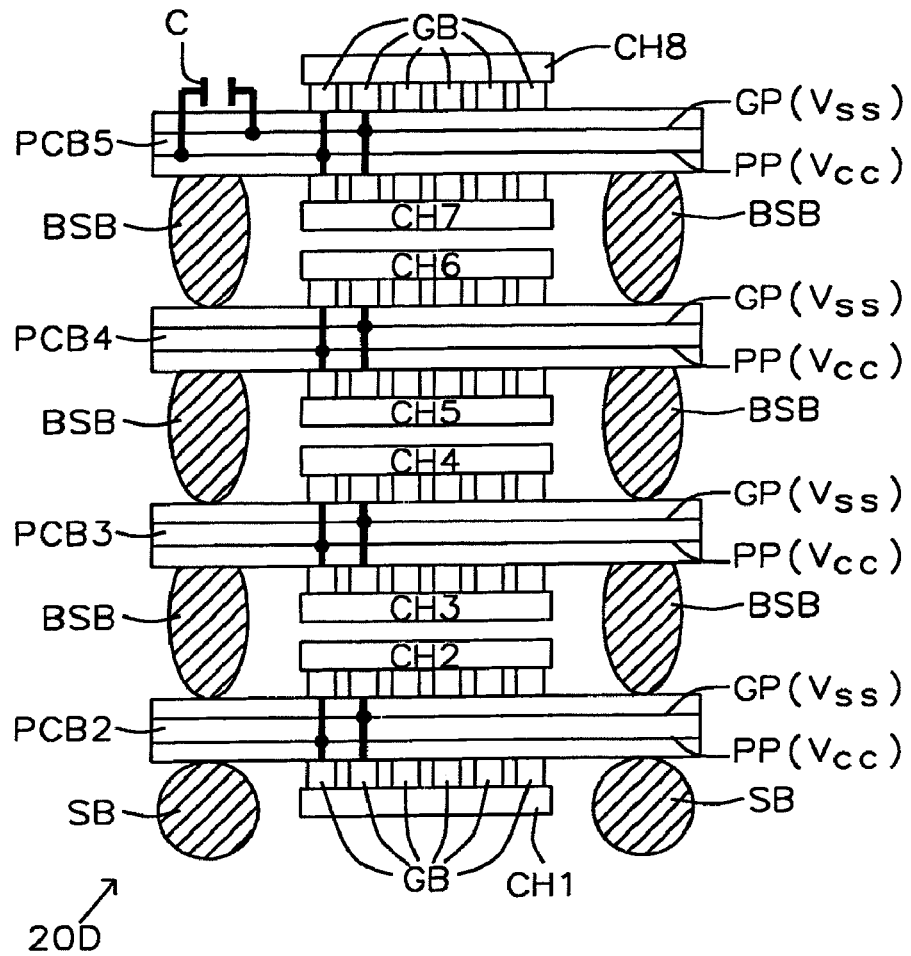
FIG. 2D shows a device which based on FIG. 2B modified to use gold bumps to support the chips to the respective printed circuit boards.

FIG. 2D shows a device 20D which is a modification of the device 20B of FIG. 2B which has been modified ti use gold bumps GB to support the chips CH1 CH8 to the respective printed circuit boards PCB2 to PCB5. An external bypass capacitor C is shown located above the top surface of a printed circuit board PCB5 at the left end thereof. The external bypass capacitor C has one terminal shown connected directly to the buried, internal ground plane GP and, as shown, has the other terminal connected directly to the buried, internal power plane PP thereof shown inside the printed circuit board PCB5. The PCB PB5 has a planar top exterior surface and the bypass capacitor C is located above the planar top exterior surface of the PCB PB5, i.e. bypass capacitor C is outside of the PCB PB5 above the planar top exterior surface thereof.

Figure 2E:
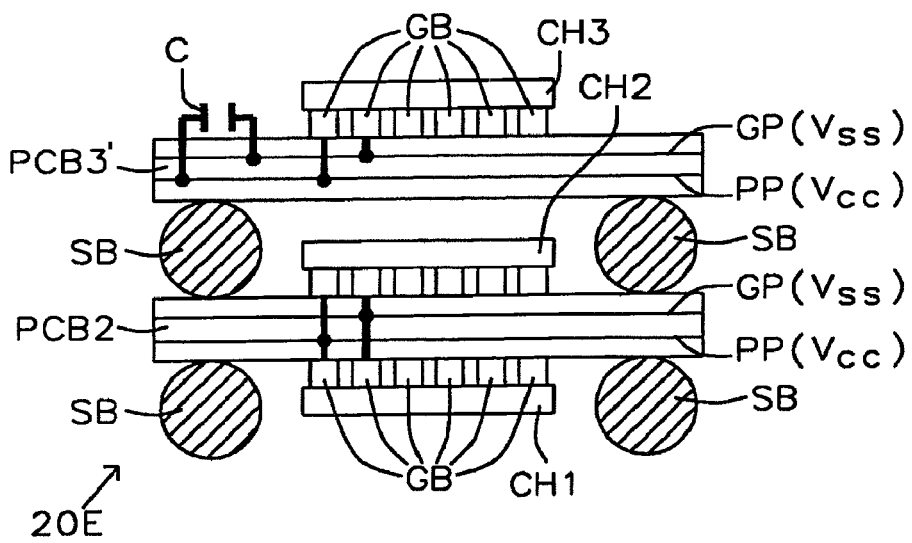
FIG. 2E shows a device 20E which is based on FIG. 2C modified to use gold bumps to support the chips on the respective printed circuit boards.

FIG. 2E shows a device 20E which is another modification of the device 20C of FIG. 2C which has been modified to use gold bumps GB to support the chips CH1 CH3 on the respective lower and upper printed circuit boards (PCBs) PBC2 and PCB3'. An external bypass capacitor C, is shown located above the top surface of the upper PCB PCB3' at the left end thereof, and it has one terminal shown connected directly to the buried, internal ground plane GP and at the other terminal shown connected directly to the buried, internal power plane PP thereof. The PCB PB3' has a planar top exterior surface and the bypass capacitor C is located above the planar top exterior surface of the PCB PB5, i.e. bypass capacitor C is outside of the PCB PB5 above the planar top exterior surface thereof.

Figure 3A:
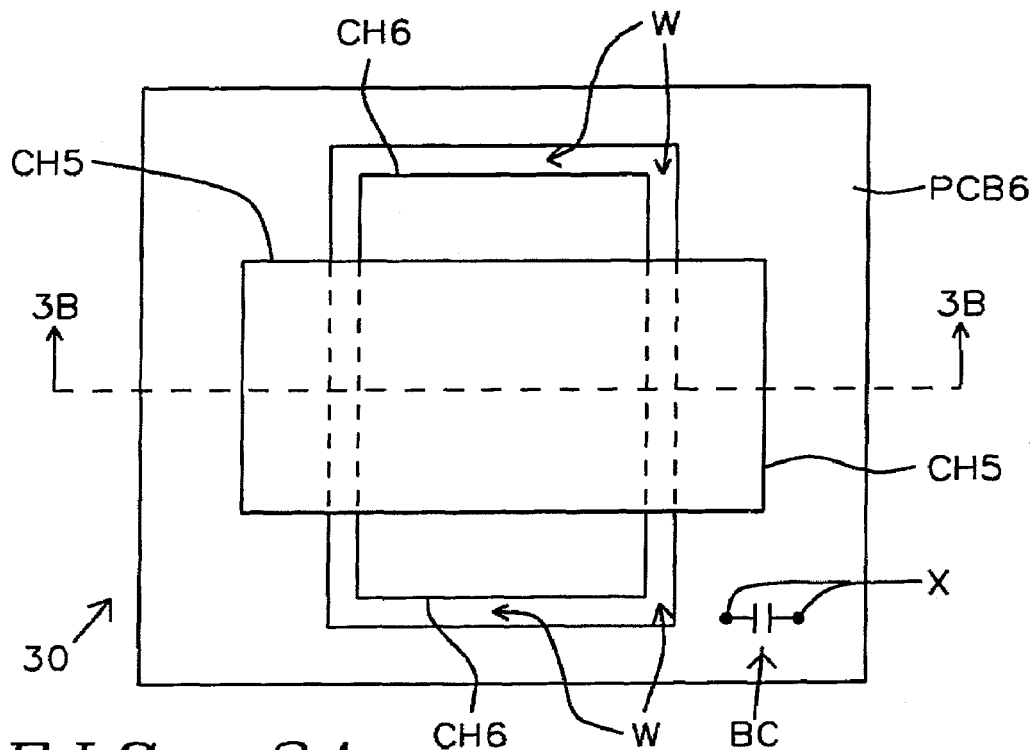
FIG. 3A shows a plan view of a chip-on-chip structure in accordance with this invention where a printed circuit board has a window formed through board in the center with a chip-on-chip structure with a first chip connected to the board extending across the window and a second chip bonded to the first chip suspended in the window.

FIG. 3A shows a plan view of a chip-on-chip structure in accordance with this invention where a printed circuit board PCB6 has a window W formed therethrough (board PCB6) in the center of FIG. 3A. Window W is shown to have a longer vertical height than the horizontal width. The board PBC6 is the substrate of a Ball Grid Array (BGA) package. A primary, upper chip CH5 is formed above the board PCB6, covering the central portion of window W having its greater length transverse to the window W thereby bridging the window W across the width of the window W. That is to say that primary chip CH5 extends on the left and right beyond window W over board PCB6 across the (narrower) width of the window W. The secondary chip CH6 is supported in a chip-on-chip connected by the lower surface of chip primary CH5. At the same time, secondary chip CH6 is located inside the space provided by window W in the printed circuit board PCB6. The chips CH5 and CH6 are shown to be the same size, i.e. primary chip CH5 is as long and as wide as secondary chip CH6 but they are rotated in orientation by about 90 degrees. A bypass capacitor BC is located on the top surface of printed circuit board PCB6 and as described above, the opposing terminals of capacitor BC are connected to a ground plane GP and the power plane PP, respectively, inside the board PCB6.

Figure 3B:
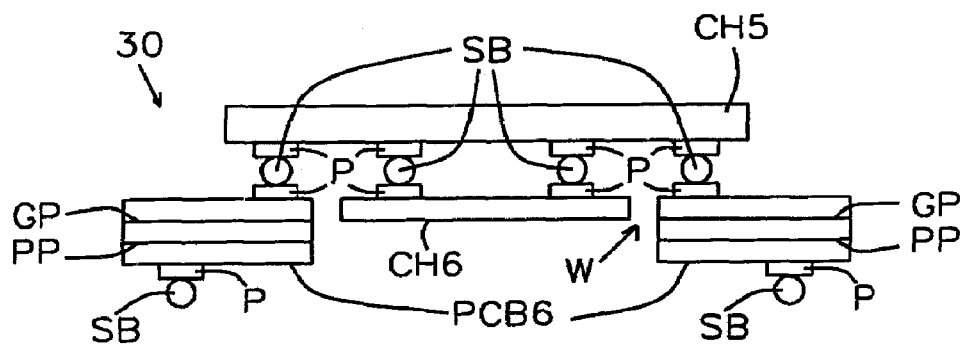
FIG. 3B shows a cross section of the device of FIG. 3A, with external connections on the bottom of the board.

FIG. 3B is a sectional view taken along line 3B-3B in FIG. 3A. In FIG. 3B, the chip-on-chip relationship between primary chip CH5 and secondary chip CH6 is seen. Pads P on the upper surface of secondary chip CH6 are connected electrically and mechanically by solder balls SB to interconnect pads P on the confronting surfaces of the primary, upper chip CH5. In like manner the lower surface of primary chip CH5, aside from secondary chip CH6, is connected to pads P on the upper surface of Printed Circuit Board PCB6. The printed circuit board PCB3 has solder balls SB and pads P located on the lower surface thereof which are adapted to be connected to another circuit board (not shown).

Figure 3C:
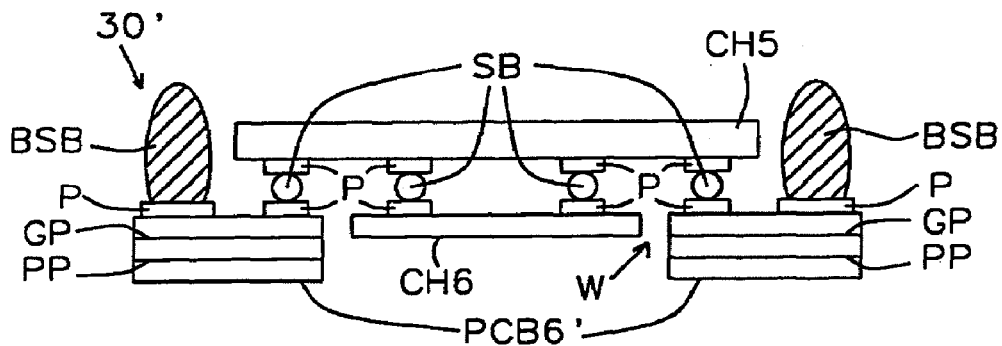
FIG. 3C shows a cross section of the device of FIG. 3A with external connections on the top of the board.

FIG. 3C is a modification of FIG. 3B in which the printed circuit board PCB6' has outboard connection pads P located aside from chip CH5 supporting large solder balls BSB which are adapted to connect the board PCB6' to another circuit board (not shown) as shown by examples in FIGS. 2A, 2B and 2D above.

Figure 3D:
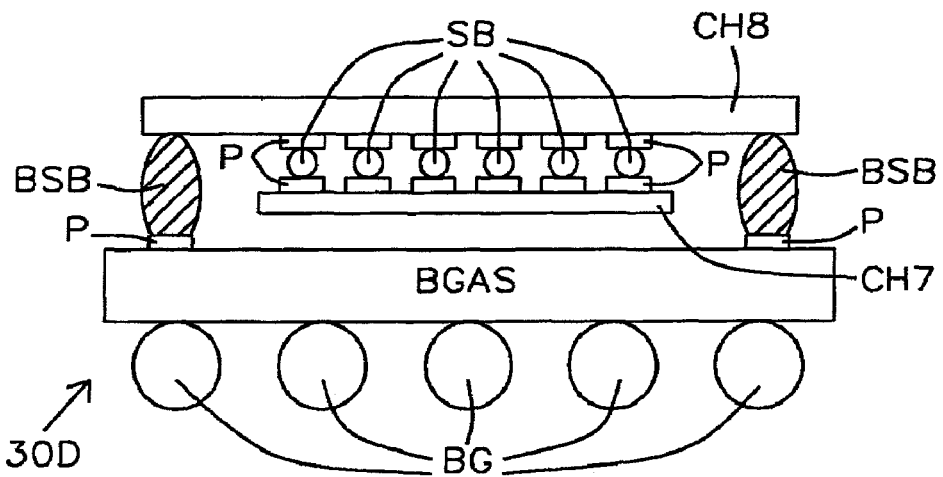
FIG. 3D shows a chip-on-chip structure wherein pads on the top surface of a secondary, chip are bonded to a plurality of solder balls which are also bonded to the bottom of an upper chip that is in turn is carried by a plurality of big solder balls secured to bottom surface thereof, with the width of the secondary chip being narrower than the length of the upper chip as in FIGS. 3A and 3B, with the big solder balls supported by pads on a ball grid array substrate.
Figure 3E:
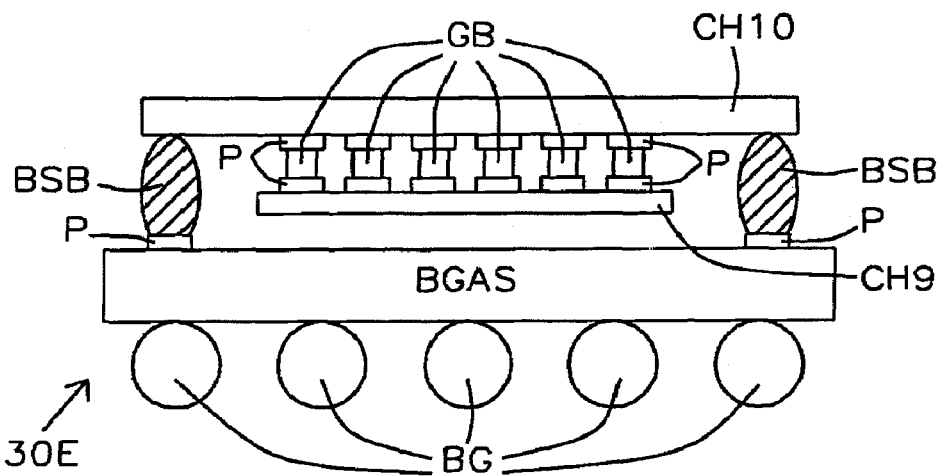
FIG. 3E shows a chip-on-chip structure wherein the pads on the top surface of a secondary chip are bonded to a plurality of gold bumps bonded to pads on the bottom of a primary chip. As in FIG. 3D, the chip is carried by a plurality of big solder balls secured to the bottom surface of a second chip on the ends thereof with the width of first chip being narrower than the length of the second chip as in FIGS. 3A and 3B, with the big solder balls supported by pads on a ball grid array substrate.

FIG. 3D shows a chip-on-chip structure wherein pads P on the top surface of a lower, secondary chip CH7 are bonded to a plurality of small, round solder balls SB shown in FIG. 3D with generally spherical shape, which are also bonded to other pads P on the bottom surface of an upper, primary chip CH8. The upper, primary chip CH8 is carried by a plurality of elongated, big solder balls BSB with generally oblate ellipsoidal (solid elliptical, i.e. foot-ball-like) shapes secured to the bottom surface of the chip CH8 on the ends thereof with the width of the secondary chip CH7 shown in FIG. 3D being narrower than the length of the primary chip CH8 as shown in FIGS. 3A and 3B. In this case, the elongated, big solder balls BSB with generally oblate ellipsoidal (football) shapes that are as shown in FIGS. 3C 3E (inter alia) extend to a lower level where they are supported on the bottom ends thereof, below the level of the chips CH7 and CH8, by lower pads P on a ball grid array substrate BGAS which is supported by a grid array of solder balls BG. The ball grid array substrate BGAS of FIG. 3D is shown with a flat upper surface which is spaced away from the flat lower surface of the secondary chip CH7 by the length of the elongated big solder balls BSB, which length exceeds the height of the secondary chip CH7 plus the heights of the solder balls SB, plus the thickness of the pads P attached to the chips CH7 and CH8, plus a gap between the flat upper surface of the ball grid array substrate BGAS and the lower flat surface of the lower, secondary chip CH7.

FIG. 3E shows a chip-on-chip structure wherein the pads P on the top surface of a secondary chip CH9 are bonded to a plurality of gold bumps GB bonded to other pads P on the bottom surface of a primary chip CH10. The gold bumps GB are pillar shape. In FIG. 3E the primary chip CH10 is carried by a plurality of elongated big solder balls BSB with generally oblate ellipsoidal (football) shapes that are secured to the bottom surface of the primary chip CH10 with the width of chip CH9 being narrower than the length of the primary chip CH10 as shown in FIGS. 3A and 3B. In this case, the oblate ellipsoidal big solder balls BSB below the chip CH10 are supported by pads P on a ball grid array substrate BGAS which is supported by a grid array of solder balls BG. In FIG. 3E, the ball grid array substrate BGAS is shown with a flat upper surface which is spaced away from the flat lower surface of the secondary chip CH9 by the length of the elongated big solder balls BSB, which length exceeds the height of the secondary chip CH9 plus the gold bumps GB, plus the thicknesses of the pads P attached to the chips CH9 and CH10, plus a gap between the flat upper surface of the substrate BGAS and the flat lower surface of the secondary chip CH9.

Figure 4:
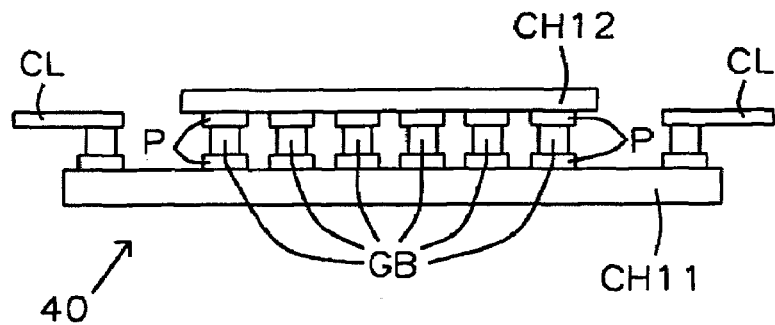
FIG. 4 shows a chip-on-chip interconnection of a primary semiconductor chip and a secondary chip with peripheral TAB connections to the primary chip.

FIG. 4 shows a chip-on-chip interconnection of a primary semiconductor chip CH11 and a secondary chip CH12. The primary chip has a top surface which is bonded to gold bonds GB which in turn are bonded to pads P on the bottom surface of the secondary chip CH12 forming chip-on-chip connections between the bottom surface of the secondary chip CH12 and the top surface of the primary chip CH11. On the periphery of the top surface of the primary semiconductor chips gold bond connections are formed aside from the secondary chip to Tape Automated Bonding (TAB) copper leads CL.

Figure 5A:
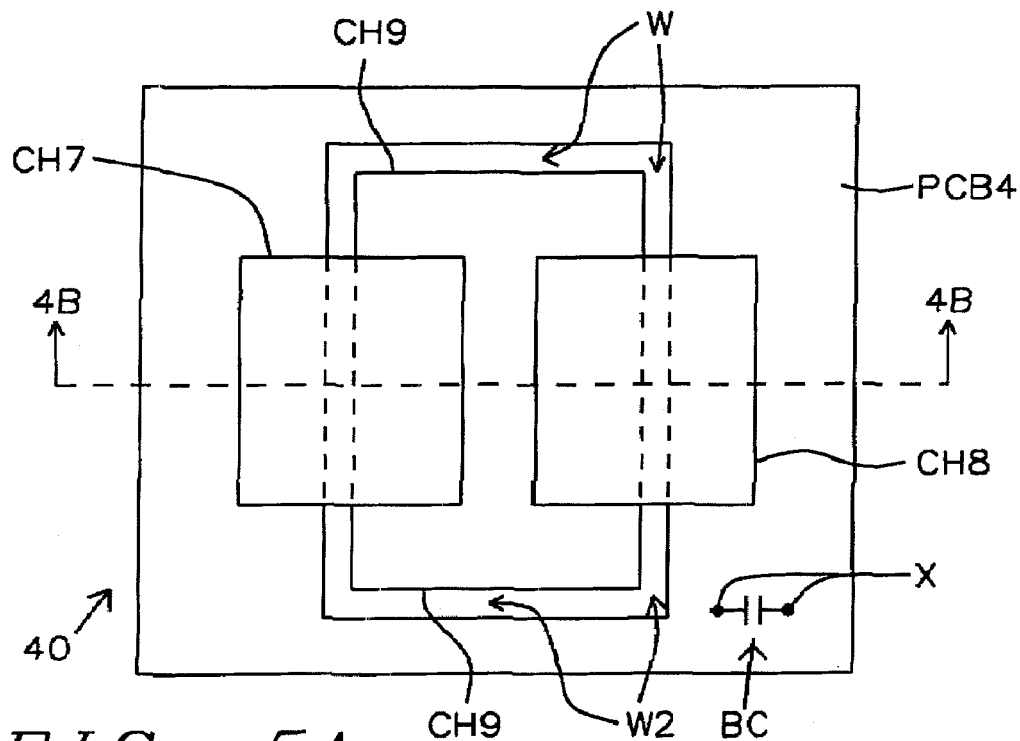
FIG. 5A shows a plan view of a plural chip to single chip chip-on-chip structure in accordance with this invention where a printed circuit board has a window formed through board in the center with a chip-on-chip structure with a first chip connected to the board extending across the window and second and third chips suspended in the window by being bonded to the first chip as in FIG. 3A.

FIG. 5A shows a plan view of a plural chip to single chip chip-on-chip structure in accordance with this invention where a printed circuit board PCB4 has a window W formed through board PCB4 in the center of FIG. 5A. A pair of primary chips CH7 and CH8 are formed above the printed circuit board PCB4 covering the central portion of window W. On the left, primary chip CH7 extends on the left beyond window W over the top surface board PCB4 to which it is connected by solder balls B and pads P, similarly to the solder bonds described above. On the right, primary chip CH8 extends on the right beyond window W over board PCB4 to which it is also connected by solder balls B and pads P. A secondary chip CH9 is located below chip CH7 and CH8 inside the window W in the board PCB4. A bypass capacitor BC is located on the top surface of board PCB4. The pads X of bypass capacitor BC are connected to the ground plane GP and the power plane PP as explained in the above described embodiments of this invention.

Figure 5B:
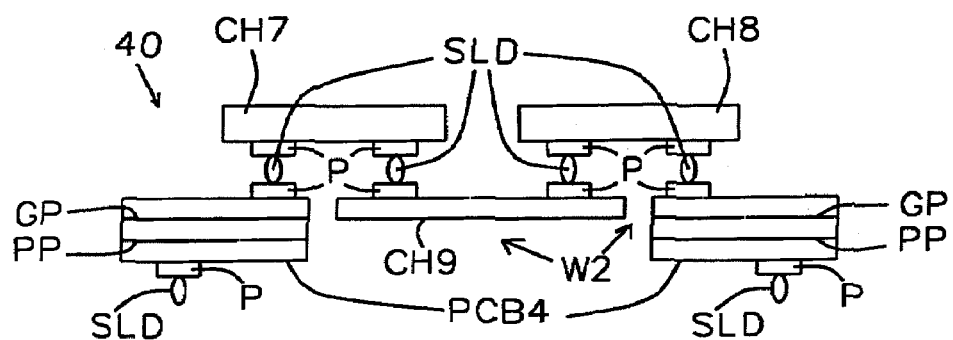
FIG. 5B shows a cross section of the device of FIG. 5A with external solder ball connections on the bottom of the board.

FIG. 5B is a sectional view taken along line 4B-4B in FIG. 5A. In FIG. 5B, it is seen that connection pads P on the upper surface of chip CH9 are bonded by solder balls SLD electrically and mechanically to interconnect pads P on the confronting surfaces of upper chips CH7/CH8. In like manner the lower surfaces of chips CH7/CH8, aside from chip CH9, are connected to pads P on the upper surface of Printed Circuit Board PCB4. For external connections, the printed circuit board PCB4 has outboard solder balls SB and pads P located on the lower surface thereof which are adapted to be connected to another circuit board (not shown). Board PCB4 is a substrate of a BGA type package.

Figure 5C:
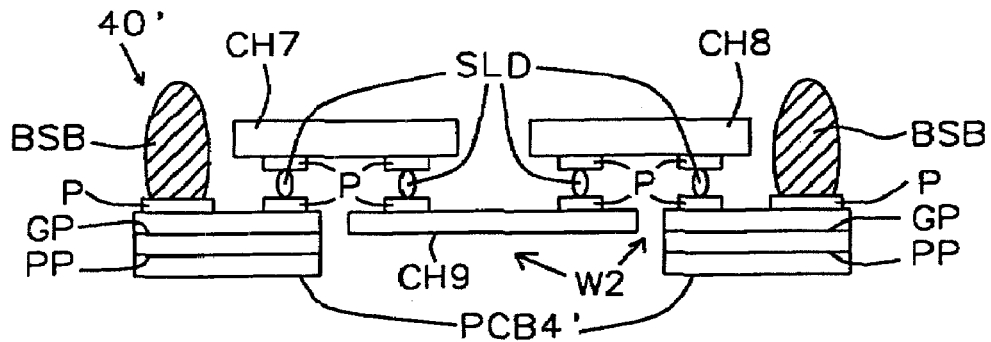
FIG. 5C shows a cross section of the device of FIG. 5A with external big solder ball connections on the top of the board.

FIG. 5C is a slight modification of FIG. 5B in which outboard connection pads P and big solder balls BSB has been added to the top surface of printed circuit board PCB4'. The big solder balls BSB on the top surface of the board PCB4', which are available for external connections, are located aside from chips CH7 and CH8 with big solder balls BSB which are adapted to connect the board PCB4' to another circuit board (not shown).

Figure 6:
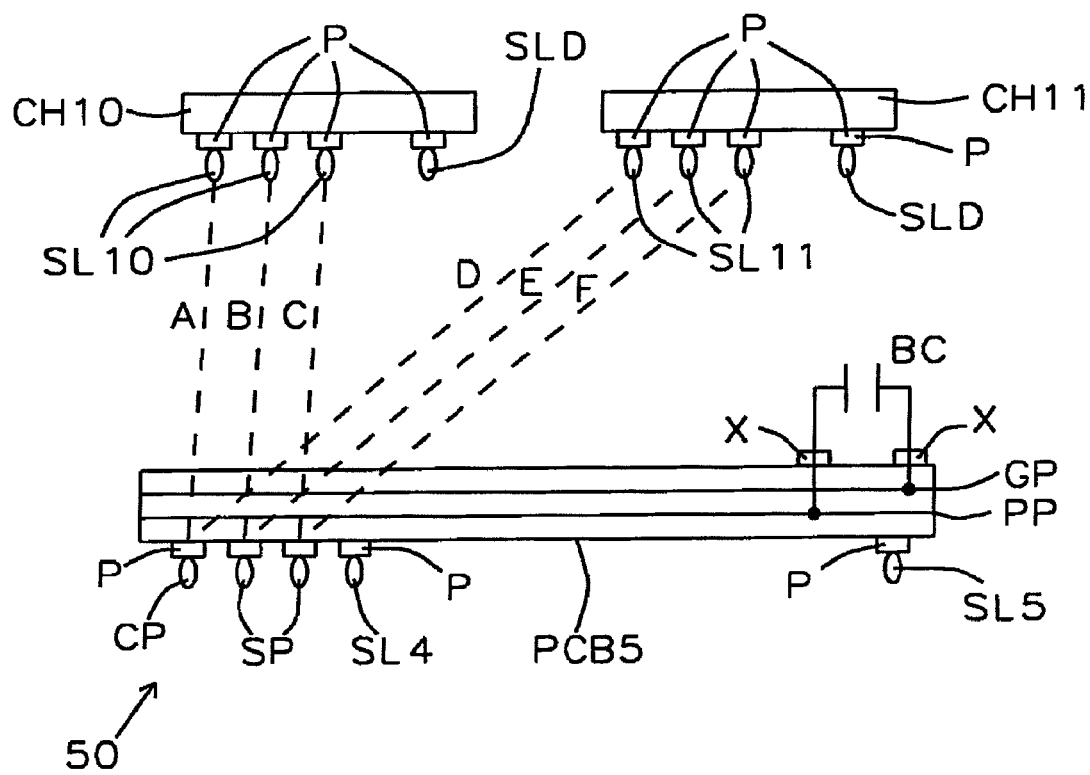
FIG. 6 shows a sectional view of a PCB which has a number of pads to which one control pin solder terminal, two selection pin solder terminals, and other solder terminals are connected. Two chips are shown connected by dotted lines between the pads on the circuit board and pins on the bottom of the chips.

FIG. 6 shows a sectional view of a PCB PCB5 which has a number of pads P to which one solder ball CP, two solder balls SP, and two solder balls SL4 and SL5 are connected. The solder ball CP functions as control. The solder balls SP function as selection. Chips CH10 and C11 are shown connected by dotted lines ABC and DEF between the pads for solder balls CP and SP and bumps SL10 and SL11 on pads P on the bottom of chips CH10 and CH11 respectively. Additional bumps SLD are also connected to the chips CH10 and CH11 by bonding to pads P. An external bypass capacitor BC is located above the top surface of PCB PCB5. The pads X of the external bypass capacitor BC are connected to the circuit board PCB5 with one pad X being connected directly to the buried, internal ground plane GP and with the other pad X being connected directly to the buried, internal power plane PP as explained in the above described embodiments of this invention. Control solder ball CP is electrically connected to bump SL10 on chip CH10 and bump SL11 on chip CH11, by the dotted line A and D connections, respectively. Selection solder balls SP connect electrically to respective bumps SL10 formed on chip CH10, by connections represented by dotted lines B and C, and to respective bumps SL11 formed on chip CH11, by connections represented by dotted lines E and F. The PCB PB5 has a planar top exterior surface and the bypass capacitor C is located above the planar top exterior surface of the PCB PB5, i.e. bypass capacitor C is outside of the PCB PB5 above the planar top exterior surface thereof.

The meaning of the dotted lines ABC and DEF in FIG. 6 indicate the connection of the control solder ball CP and the selection solder ball SP of board PCB5 to the respective control solder bumps and the selection solder bumps of chips CH10 and CH11. Chips CH10 and CH11 are connected to the board PCB5 by the flip-chip method. The control solder bumps on chips CH10 and CH11 are electrically connected to the control solder ball CP on circuit board PCB5 through interconnection metal lines in circuit board PBC5. The selection solder bumps on chips CH10 and CH11 are connected to the selection solder ball SP on circuit board PBC5 through other interconnection metal lines in circuit board PCB5.

EXAMPLE OF APPLICATION

If there are two chips having data-width options, such as .times.4, .times.8 or .times.16 option, packaged in one package, then this package can be performed with the data width of .times.4, .times.8, .times.16 or .times.32.

The meaning of the .times.4 option is that the width of the data is 4 bits in an integrated circuit memory.

FIG. 5A-5C. show the inventive concept that optional functions can be provided in a multiple chip package made in accordance with this invention. In the prior art, optional functions are possible only on a single chip level, whereas with the configurations shown in FIGS. 5A-5C. and previous drawings, the function of chips can be fixed after completion of the packaging process.

FIG. 6 and the embodiments from FIGS. 1A to 1D, FIGS. 2A to 2E, FIGS. 3A to 3E, and FIGS. 5A to 5C all include a bypass capacitor. All of the printed circuit boards include a ground plane and a power plane. The bypass capacitors are connected between the ground plane and the power plane. The pad options illustrated by FIG. 5 can be employed in the embodiments from FIG. 1A to FIG. 4C.

SUMMARY

A bonding option for a multiple chip package is provided.

Methods of mounting discrete chips on a chip package or multi-chip package which may include a bypass capacitor, a ground plane and a power plane.

Flexibility of functions of a multiple chip packages is enhanced.

There is a separate inventory of products with different functions.

A control circuit design in the single chip provides for function selection.

The bypass capacitor is packed in a package or in combination chip package. The bypass capacitor is connected to the ground plane and the power plane of the substrate of the package. A big solder ball is employed for packages when the bypass capacitor is located on the same surface with the solder balls which are adapted to be connected to another circuit board.

A problem solved by this invention is reduction of the inventory of several products with different functions.

This invention serves to eliminate I/O noise.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A chip package comprising:
   a first circuit substrate comprising a first pad at a top side of said first circuit substrate;
   a first solder ball contacting a bottom side of said first circuit substrate;
   a first chip over said top side of said first circuit substrate, wherein said first chip is connected to said first pad; and
   a second chip over said first chip; and a portion over said top side of said first circuit substrate and over said first and second chips, wherein said portion comprises a second circuit substrate over said top side of said first circuit substrate and over said first and second chips, a third chip over a top side of said second circuit substrate, a second solder ball having a top end contacting a bottom side of said second circuit substrate and a bottom end contacting said top side of said first circuit substrate, and a third solder ball having a top end contacting said bottom side of said second circuit substrate and a bottom end contacting said top side of said first circuit substrate, wherein said second circuit substrate comprises a second pad at said top side of said second circuit substrate, wherein said third chip is connected to said second pad, wherein said first and second chips are directly horizontally between said second and third solder balls, wherein said first and second chips are between said top side of said first circuit substrate and said bottom side of said second circuit substrate.

2. The chip package of claim 1 further comprising a metal bump between said first chip and said top side of said first circuit substrate.

3. The chip package of claim 1 further comprising a solder bump between said first chip and said top side of said first circuit substrate.

4. The chip package of claim 1, wherein said portion further comprises a metal bump between said third chip and said top side of said second circuit substrate.

5. The chip package of claim 1, wherein said portion further comprises a solder bump between said third chip and said top side of said second circuit substrate.

6. The chip package of claim 1, wherein said portion further comprises a capacitor on said second circuit substrate.

7. The chip package of claim 1 further comprising a metal bump between said second chip and said bottom side of said second circuit substrate.

8. A chip package comprising:
a first circuit substrate comprising a first pad at a top side of said first circuit substrate;
a first solder ball contacting a bottom side of said first circuit substrate;
a first chip over said top side of said first circuit substrate, wherein said first chip is connected to said first pad;
a second chip over said first chip;
a second circuit substrate over said top side of said first circuit substrate and over said first and second chips, wherein said second circuit substrate comprises a second pad at a top side of said second circuit substrate, wherein said first and second chips are between said top side of said first circuit substrate and a bottom side of said second circuit substrate;
a second solder ball having a top end contacting said bottom side of said second circuit substrate and a bottom end contacting said top side of said first circuit substrate;
a third solder ball having a top end contacting said bottom side of said second circuit substrate and a bottom end contacting said top side of said first circuit substrate, wherein said first and second chips are directly horizontally between said second and third solder balls;
a third chip over said top side of said second circuit substrate, wherein said third chip is connected to said second pad; and
a fourth chip over said third chip.

9. The chip package of claim 8 further comprising a metal bump between said first chip and said top side of said first circuit substrate.

10. The chip package of claim 8 further comprising a solder bump between said first chip and said top side of said first circuit substrate.

11. The chip package of claim 8 further comprising a metal bump between said third chip and said top side of said second circuit substrate.

12. The chip package of claim 8 further comprising a solder bump between said third chip and said top side of said second circuit substrate.

13. The chip package of claim 8 further comprising a third circuit substrate over said top side of said second circuit substrate and over said third and fourth chips, a fourth solder ball having a top end on a bottom side of said third circuit substrate and a bottom end on said top side of said second circuit substrate, and a fifth solder ball having a top end on said bottom side of said third circuit substrate and a bottom end on said top side of said second circuit substrate, wherein said third and fourth chips are directly horizontally between said fourth and fifth solder balls.

14. The chip package of claim 8 further comprising a metal bump between said second chip and said bottom side of said second circuit substrate.

15. A chip package comprising:
a portion comprising a first circuit substrate, a first solder ball contacting a bottom side of said first circuit substrate, and a first chip over a top side of said first circuit substrate, wherein said first chip is connected to a first pad of said first circuit substrate at said top side of said first circuit substrate;
a second circuit substrate over said top side of said first circuit substrate and over said first chip, wherein said second circuit substrate comprises a second pad at a top side of said second circuit substrate, wherein said first chip is between said top side of said first circuit substrate and a bottom side of said second circuit substrate;
a second solder ball having a top end contacting said bottom side of said second circuit substrate and a bottom end contacting said top side of said first circuit substrate;
a third solder ball having a top end contacting said bottom side of said second circuit substrate and a bottom end contacting said top side of said first circuit substrate, wherein said first chip is directly horizontally between said second and third solder balls;
a second chip over said top side of said second circuit substrate, wherein said second chip is connected to said second pad; and
a third chip over said second chip wherein said second solder ball has a height greater than a vertical distance between a top side of said second chip and a bottom side of said third chip.

16. The chip package of claim 15, wherein said portion further comprises a metal bump between said first chip and said top side of said first circuit substrate.

17. The chip package of claim 15, wherein said portion further comprises a solder bump between said first chip and said top side of said first circuit substrate.

18. The chip package of claim 15 further comprising a metal bump between said second chip and said top side of said second circuit substrate.

19. The chip package of claim 15 further comprising a solder bump between said second chip and said top side of said second circuit substrate.

20. The chip package of claim 15 further comprising a third circuit substrate over said top side of said second circuit substrate and over said second and third chips, a fourth solder ball having a top end on a bottom side of said third circuit substrate and a bottom end on said top side of said second circuit substrate, and a fifth solder ball having a top end on said bottom side of said third circuit substrate and a bottom end on said top side of said second circuit substrate, wherein said second and third chips are directly horizontally between said fourth and fifth solder balls.

21. A chip package comprising:
a circuit substrate;
a first metal bump contacting a bottom side of said circuit substrate;
a first chip over a top side of said circuit substrate;
a second metal bump between a top side of said circuit substrate and a bottom side of said first chip, wherein said second metal bump has a top end contacting said bottom side of said first chip and a bottom end contacting said top side of said circuit substrate;
a second chip over said first chip and said top side of said circuit substrate;
a third chip over said second chip and said top side of said circuit substrate;
a third metal bump between a top side of said second chip and a bottom side of said third chip, wherein said third metal bump has a bottom end contacting said top side of said chip;
a fourth chip over said third chip and said top side of said circuit substrate; and
a fourth metal bump between a top side of said third chip and said fourth chip, wherein said fourth metal bump has a bottom end contacting said top side of said third chip, wherein said first metal bump has a height greater than that of said second metal bump, than that of said third metal bump, than that of said fourth metal bump and than a vertical distance between a top side of said first chip and a bottom side of said second chip.

22. The chip package of claim 21, wherein said second metal bump comprises a gold bump.

23. The chip package of claim 21, wherein said second metal bump comprises a solder bump.

24. The chip package of claim 21 further comprising a fifth chip under said bottom side of said circuit substrate, and a fifth metal bump having a bottom end contacting a top side of said fifth chip and a top end contacting said bottom side of said circuit substrate.

25. The chip package of claim 8, wherein said second circuit substrate has a thickness greater than a vertical distance between a top side of said third chip and a bottom side of said fourth chip.

26. The chip package of claim 15, wherein said second circuit substrate has a thickness greater than a vertical distance between a top side of said second chip and a bottom side of said third chip.

27. The chip package of claim 1, wherein said first solder ball has a height greater than a vertical distance between a top side of said first chip and a bottom side of said second chip.

28. The chip package of claim 1, wherein said second solder ball has a height greater than a vertical distance between a top side of said first chip and a bottom side of said second chip.

29. The chip package of claim 8, wherein said first solder ball has a height greater than a vertical distance between a top side of said first chip and a bottom side of said second chip.

30. The chip package of claim 8, wherein said first solder ball has a height greater than a vertical distance between a top side of said third chip and a bottom side of said fourth chip.

31. The chip package of claim 8, wherein said second solder ball has a height greater than a vertical distance between a top side of said first chip and a bottom side of said second chip.

32. The chip package of claim 8, wherein said second solder ball has a height greater than a vertical distance between a top side of said third chip and a bottom side of said fourth chip.

33. The chip package of claim 21, wherein said third metal bump comprises a gold bump.

34. The chip package of claim 21, wherein said third metal bump comprises a solder bump.

* * * * *